(12) United States Patent
Henley et al.

(10) Patent No.: US 7,427,554 B2
(45) Date of Patent: Sep. 23, 2008

(54) MANUFACTURING STRAINED SILICON SUBSTRATES USING A BACKING MATERIAL

(75) Inventors: Francois J. Henley, Aptos, CA (US); Harry R. Kirk, Campbell, CA (US)

(73) Assignee: Silicon Genesis Corporation, San Jose, CA (US)

( * ) Notice: Subject to any disclaimer, the term of this patent is extended or adjusted under 35 U.S.C. 154(b) by 469 days.

(21) Appl. No.: 11/203,547

(22) Filed: Aug. 12, 2005

(65) Prior Publication Data

US 2007/0037323 A1    Feb. 15, 2007

(51) Int. Cl.
H01L 21/46 (2006.01)
H01L 21/30 (2006.01)

(52) U.S. Cl. .......................... 438/457; 438/455; 257/18

(58) Field of Classification Search ................ 438/455, 438/457, 458, 464; 257/18, 19, 347
See application file for complete search history.

(56) References Cited

U.S. PATENT DOCUMENTS 2,981,877 A   4/1961  Noyce
4,363,828 A  12/1982  Brodsky et al.
4,585,671 A   4/1986  Kitagawa et al.

(Continued)

FOREIGN PATENT DOCUMENTS

WO    WO 99/08316    2/1999

OTHER PUBLICATIONS

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

(Continued)

*Primary Examiner*—Phuc T Dang
(74) *Attorney, Agent, or Firm*—Townsend and Townsend and Crew LLP

(57) ABSTRACT

A method for forming a strained silicon layer of semiconductor material. The method includes providing a deformable surface region having a first predetermined radius of curvature, which is defined by R(1) and is defined normal to the surface region. A backing plate is coupled to the deformable surface region to cause the deformable surface region to be substantially non-deformable. The method includes providing a first substrate (e.g., silicon wafer) having a first thickness. Preferably, the first substrate has a face, a backside, and a cleave plane defined within the first thickness. The method includes a step of overlying the backside of the first substrate on a portion of the surface region having the predetermined radius of curvature to cause a first bend within the thickness of material to form a first strain within a portion of the first thickness. The method provides a second substrate having a second thickness, which has a face and a backside. The method includes a step of overlying the face of the second substrate on a portion of the face of the first substrate to cause a second bend within the thickness of material to form a second strain within a portion of the second thickness. A step of joining the face of the second substrate to the face of the first substrate form a sandwich structure while maintaining the first bend in the first substrate and the second bend in the second substrate. Preferably, joining occurs using a low temperature process such as plasma activated bonding or the like.

16 Claims, 18 Drawing Sheets

U.S. PATENT DOCUMENTS

| | | | |
|---|---|---|---|
| 4,696,758 | A | 9/1987 | Ovshinsky et al. |
| 5,120,394 | A | 6/1992 | Mukai |
| 5,789,030 | A | 8/1998 | Rolfson |
| 5,877,070 | A | 3/1999 | Goesele et al. |
| 6,013,563 | A | 1/2000 | Henley et al. |
| 6,033,974 | A | 3/2000 | Henley et al. |
| 6,100,166 | A | 8/2000 | Sakaguchi et al. |
| 6,103,599 | A | 8/2000 | Henley et al. |
| 6,171,965 | B1 | 1/2001 | Kang et al. |
| 6,180,496 | B1 | 1/2001 | Farrens et al. |
| 6,287,941 | B1 | 9/2001 | Kang et al. |
| 6,368,930 | B1 | 4/2002 | Enquist |
| 6,455,397 | B1 | 9/2002 | Belford |
| 6,455,399 | B2 | 9/2002 | Malik et al. |
| 6,500,694 | B1 | 12/2002 | Enquist |
| 6,514,836 | B2 | 2/2003 | Belford |
| 6,534,381 | B2 | 3/2003 | Cheung et al. |
| 6,563,133 | B1 | 5/2003 | Tong |
| 6,586,785 | B2 | 7/2003 | Flagan |
| 6,627,531 | B2 | 9/2003 | Enquist |
| 6,653,212 | B1 | 11/2003 | Yamanaka et al. |
| 6,699,531 | B1 | 3/2004 | Fukiage |
| 6,716,751 | B2 | 4/2004 | Todd |
| 6,723,606 | B2 | 4/2004 | Flagan |
| 6,740,909 | B2 | 5/2004 | Enquist |
| 6,756,281 | B2 | 6/2004 | Enquist |
| 6,771,410 | B1 | 8/2004 | Bourianoff |
| 6,804,062 | B2 | 10/2004 | Atwater |
| 6,818,529 | B2 | 11/2004 | Bachrach et al. |
| 6,821,825 | B2 | 11/2004 | Todd et al. |
| 6,822,326 | B2 | 11/2004 | Enquist et al. |
| 6,858,107 | B2 | 2/2005 | Ghyselen et al. |
| 6,858,517 | B2 | 2/2005 | Martinez et al. |
| 6,864,585 | B2 | 3/2005 | Enquist |
| 6,867,073 | B1 | 3/2005 | Enquist |
| 6,875,671 | B2 | 4/2005 | Faris |
| 6,884,696 | B2 | 4/2005 | Aga et al. |
| 6,900,115 | B2 | 5/2005 | Todd |
| 6,902,987 | B1 | 6/2005 | Tong et al. |
| 6,905,557 | B2 | 6/2005 | Enquist |
| 6,962,858 | B2 | 11/2005 | Neyret et al. |
| 6,962,859 | B2 | 11/2005 | Todd et al. |
| 7,019,339 | B2 | 3/2006 | Atwater |
| 7,029,995 | B2 | 4/2006 | Todd et al. |
| 7,229,899 | B2 * | 6/2007 | Moriceau et al. ............ 438/458 |
| 2002/0168868 | A1 | 11/2002 | Todd |
| 2002/0173113 | A1 | 11/2002 | Todd |
| 2002/0190269 | A1 | 12/2002 | Atwater |
| 2002/0197831 | A1 | 12/2002 | Todd et al. |
| 2003/0082300 | A1 | 5/2003 | Todd et al. |
| 2003/0095340 | A1 | 5/2003 | Atwater |
| 2003/0111013 | A1 | 6/2003 | Oosterlaken et al. |
| 2003/0129545 | A1 | 7/2003 | Kik |
| 2003/0162367 | A1 * | 8/2003 | Roche ........................ 438/460 |
| 2003/0230629 | A1 | 12/2003 | Bourianoff |
| 2003/0230778 | A1 | 12/2003 | Park et al. |
| 2004/0214434 | A1 | 10/2004 | Atwater |
| 2005/0026400 | A1 | 2/2005 | Todd et al. |
| 2005/0026432 | A1 | 2/2005 | Atwater |
| 2005/0085049 | A1 | 4/2005 | Atwater |
| 2005/0092235 | A1 | 5/2005 | Brabant et al. |
| 2005/0118754 | A1 | 6/2005 | Henley |
| 2005/0142879 | A1 | 6/2005 | Atwater |
| 2005/0153524 | A1 | 7/2005 | Maa et al. |
| 2005/0208740 | A1 | 9/2005 | Todd |
| 2005/0245049 | A1 | 11/2005 | Akatsu et al. |
| 2005/0247924 | A1 | 11/2005 | Atwater |
| 2005/0250302 | A1 | 11/2005 | Todd et al. |
| 2005/0272222 | A1 | 12/2005 | Flamand et al. |
| 2005/0275067 | A1 | 12/2005 | Atwater |
| 2006/0019464 | A1 | 1/2006 | Maa et al. |
| 2006/0021565 | A1 | 2/2006 | Zahler |
| 2006/0024435 | A1 | 2/2006 | Holunga |
| 2006/0030124 | A1 | 2/2006 | Maa et al. |
| 2006/0030131 | A1 | 2/2006 | Richardson |
| 2006/0060943 | A1 | 3/2006 | Mohamed et al. |
| 2006/0071213 | A1 | 4/2006 | Ma et al. |
| 2006/0088985 | A1 | 4/2006 | Haverkort et al. |
| 2006/0108688 | A1 | 5/2006 | Richardson |
| 2006/0112986 | A1 | 6/2006 | Atwater |

OTHER PUBLICATIONS

Agarwal, et. al., Efficient Production of Silicon-on-Insulator Films by Co-Implantation of the He+ with H+, Applied Physics, Mar. 2, 1998, Letters, vol. 72, No. 9.

Bennett et al., Complete Surface Exfoliation of 4H-SiC by H+—and Si+ Coimplantation, Applied Physics Letters, vol. 76, No. 22, May 29, 2000.

Brendel, A Novel Process for Ultrathin Monocrystalline Silicon Solar Cells on Glass, 14th European Photovoltaic Solar Energy Conference, Jun. 30 to Jul. 4, 1997, Barcelona, Spain.

Brendel, Crystalline Thin-film Silicon Solar Cells from Layer-Transfer Processes: A Review, Proc. 10th Workshop on Crystalline Silicon Solar Cell Materials and Processes, Aug. 13-16, 2000, Copper Mountain, USA, ed. by B.L. Sopori, (NREL, Golden, 2000).

Deboer, Low Temperature Epitaxial Silicon Growth Using Electron Cyclotron Resonance Plasma Deposition, Dissertation, Iowa State University, Ames, IA 1995.

Deboer et al., Preparation and Properties of High Quality Crystalline Silicon Films Grown by ECR Plasma Deposition, IEEE, Hawaii, Dec. 5-9, 1994.

De Moor, Technology Development for 3D Integration at IMEC "3D Architectures for Semiconductor Integration and Packaging", Tempe AZ Jun. 13-15, 2005.

Deng et. al., High Efficiency and High Rate Deposited Amorphous Silicon-Based Solar Cells, Phase II, Annual Technical Progress Report, Sep. 1, 2002 to Aug. 31, 2003 NREL Subcontract No. NDY-2-30630-08.

Du et. al., Impact of Hydrogen dilution on Microstruture and Optoelectronic Properties of Silicon Films Deposited using Trisilane, J. Phys D: Appl. Phys. 38 (2005) pp. 838-842.

Duo et al., Comparison Between the Different Implantation Orders in H+ and He+ Coimplantation, Journal of Physics D: Applied Physics, 34, 477-482, 2001.

Ellis Jr., et. al., Chemical Vapor Deposition of Boron-Doped Hydrogenated Amorphous Silicon, App. Phys. Lett, 47 (2), Jul. 15, 1985, p. 135.

Feijoo et al., Prestressing of Bonded Wafers. Proceedings of the First International Symposium on Semiconductor Wafer Bonding: Science, Technology and Applications, The Electrochemical Society, vol. 92-7, New York, NY 1992.

Garrou, 3D Integration: A Status Report "3D Architectures for Semiconductor Integration and Packaging", Tempe AZ Jun. 13-15, 2005.

Gösele, Semiconductor Wafer Bonding: Science Technology and Applications, Electrochemical Society Proceedings, vol. 97-36, pp. 229-248.

Gui et al., The Effect of Surface Roughness on Direct Wafer Bonding, Journal of Applied Physics vol. 85, No. 10, May 15, 1999.

Gui et al., Selective Wafer Bonding by Surface Roughness Control, Journal of the Electrochemical Society, 148 (4), G225-228, 2001.

Henttinen et al., Cold Ion-Cutting of Hydrogen Implanted Si, Nuclear Instruments and Methods in Physics Research B, 190, 761-766, 2002.

Huff et. al. Silicon Materials Science and Technology, Electrochemical Society Proceedings vol. 98-1, pp. 1385-1394.

Hurley et al., Ion Implantation of Hydrogen and Helium into Silicon Wafers for Layer Transfer in Devices, Vacuum, 78, 167-175, 2005.

Joly, New Wafer to Wafer and Chip to Wafer Device Stacking Technology Implementations "3D Architectures for Semiconductor Integration and Packaging", Tempe AZ Jun. 13-15, 2005.

Kumata et. al., Photochemical Vapor Deposition of Hydrogenated Amorphous Silicon Films from Disilane and Trisilane using a Low Pressure Mercury Lamp, Appl. Phys. Lett 48 (20) May 19, 1986, p. 1380.

Morrison et. al., Deposition of Amorphous and Micro-Crystalline Silicon using a Graphite Filament in the Hot Wire CVD Technique, J. Vac. Sci. Technol A19 (6), Nov./Dec. 2001, p. 2817.

Reber et. al., Progress in High-Temperature Silicon Epitaxy using the RTCVD160 Processor, presented at the 19th European Solar Energy Conference, Jun. 7-11, 2004, Paris.

Roth et. al., Kinetics of Solid Phase Epitaxy in Thick Amorphous Si Layers formed by MeV Ion Implantation, Appl. Phys. Lett 57 (13) Sep. 24, 1990, p. 1340.

Saraswat, 3-Dimensional ICs: Motivation, Performance Analysis and Technology "3D Architectures for Semiconductor Integration and Packaging", Tempe AZ Jun. 13-15, 2005.

Sarma et al., Silicon-on-Quartz for Low Power Electronic Applications, Proceedings 1994 IEEE International SOI Conference, Oct. 1994.

Shi et al., Characterization of Low-Temperature Processed Single-Crystalline Silicon Thin-Film Transistor on Glass, IEEE Electron Device Letters, vol. 24, No. 9, Sep. 2003.

Stradins et. al., Physics of Solid-Phase Epitaxy of Hydrogenated Amorphous Silicon for Thin Film Si Photovoltaics, Materials Research Society Spring Meeting, San Francisco, 2006.

Takagi et al., Wafer-Scale Room-Temperature Bonding Between Silicon and Ceramic Wafers by Means of Argon-Beam Surface Activation, IEEE, 2001.

Tong et al., Low Temperature Si Layer Splitting, Proceedings 1997 IEEE International SOI Conference, Oct. 1997.

Venezia et al., The Role of Implantation Damage in the Production of Silicon-On-Insulator Films by Co-Implantation of He+ and H+, Proceedings of the Eighth International Symposium on Silicon Materials Science and Technology, vol. 98-1, 1998.

Voltaix Currents, Responding to Trends in Solar, Voltaix Currents, Spring Newsletter, Apr. 2005.

Walker, 3D Packaging: Density, Design and Decisions "3D Architectures for Semiconductor Integration and Packaging", Tempe AZ Jun. 13-15, 2005.

Wang et. al, 17.8% P Type Heterojunction Silicon Solar Cells by HWCVD, National Renewable Energy Laboratory, Colorado, PowerPoint Presentation, Spring 2006.

Weldon et al., On The Mechanism of The Hydrogen-Induced Exfoliation of Silicon, J. Vac. Science Tech. B, 15(4), Jul./Aug. 1997.

Weldon et al., Mechanistic Studies of Silicon Wafer Bonding and Layer Exfoliation, Proceedings of the Fourth National Symposium on Semiconductor Wafer Bonding: Science, Technology, and Applications, vol. 97-36, 1998.

Weldon et al., Mechanism of Silicon Exfoliation Induced by Hydrogen/Helium co-Implantation, Applied Physics Letter, vol. 73, No. 25, Dec. 21, 1998.

Lee et al. "Strained silicon thin-film transistors fabricated on glass", Applied Physics Letters 86, 103504 (2005).

* cited by examiner

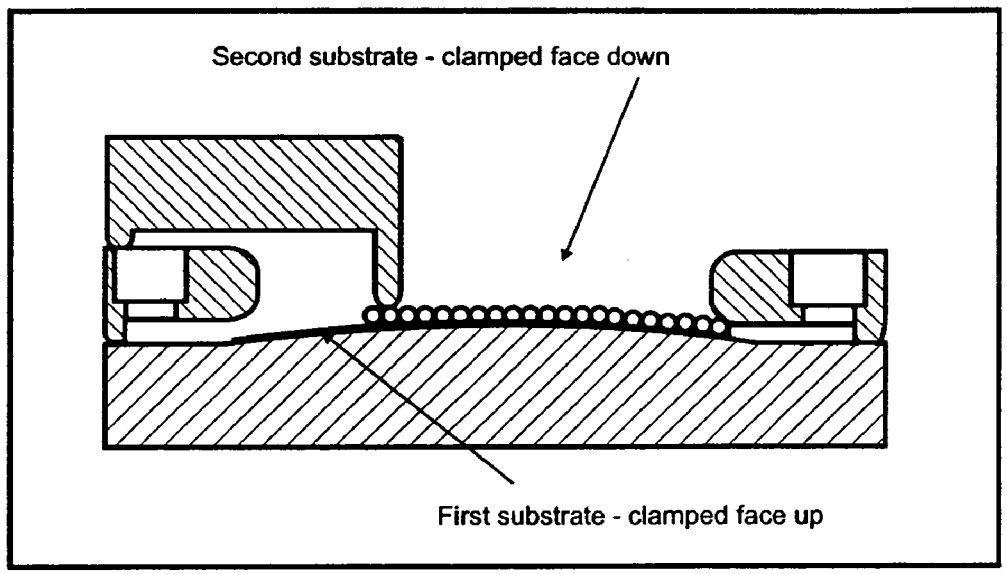
FIGURE 9. Substrate Bonding Assembly
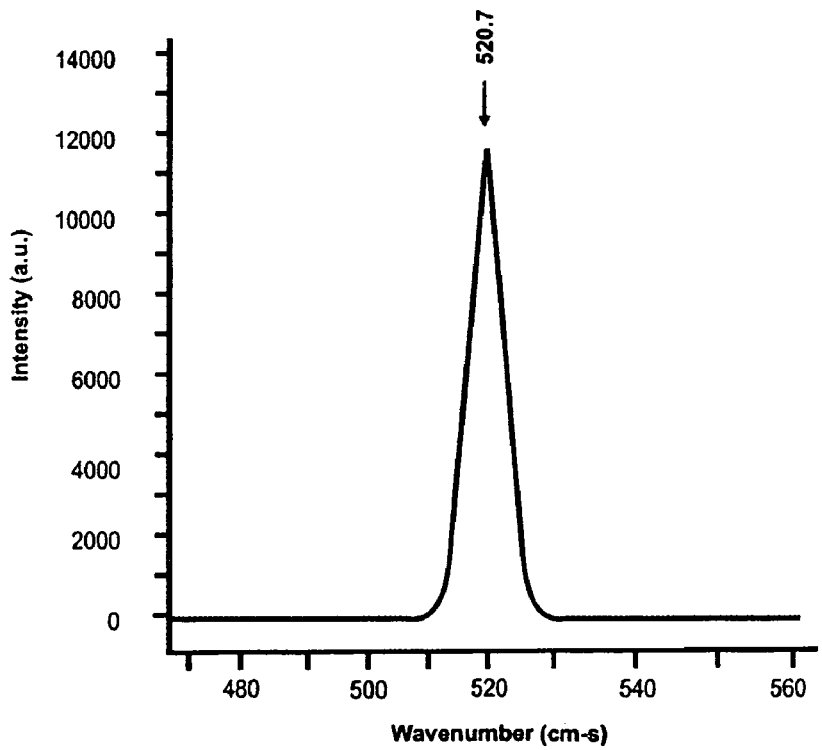
FIGURE 10. Raman Spectrum Si-1: EAG Si Reference

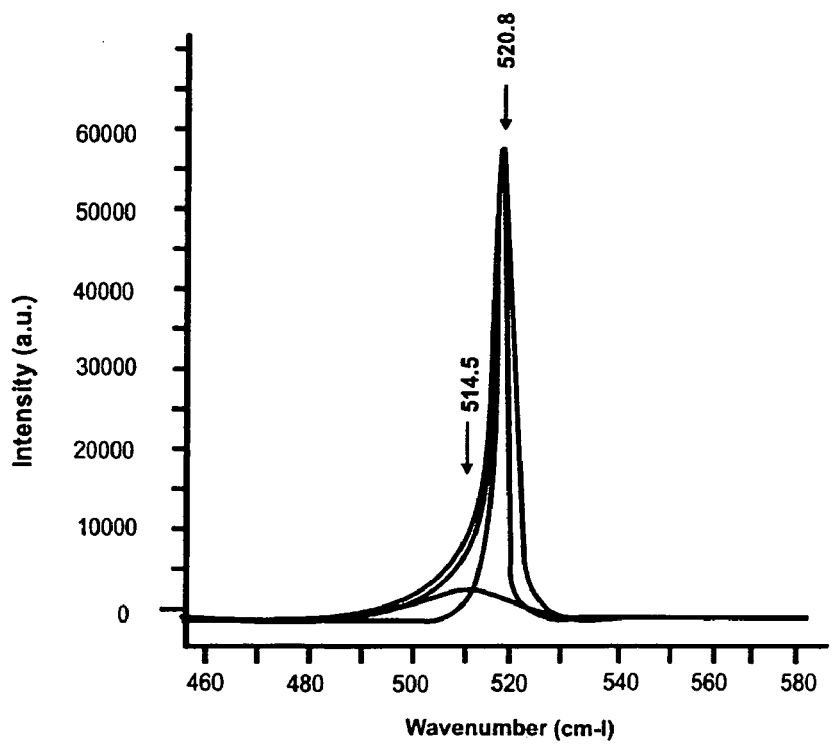
FIGURE 11. Raman Spectrum 1: "Flat" Bonding Reference
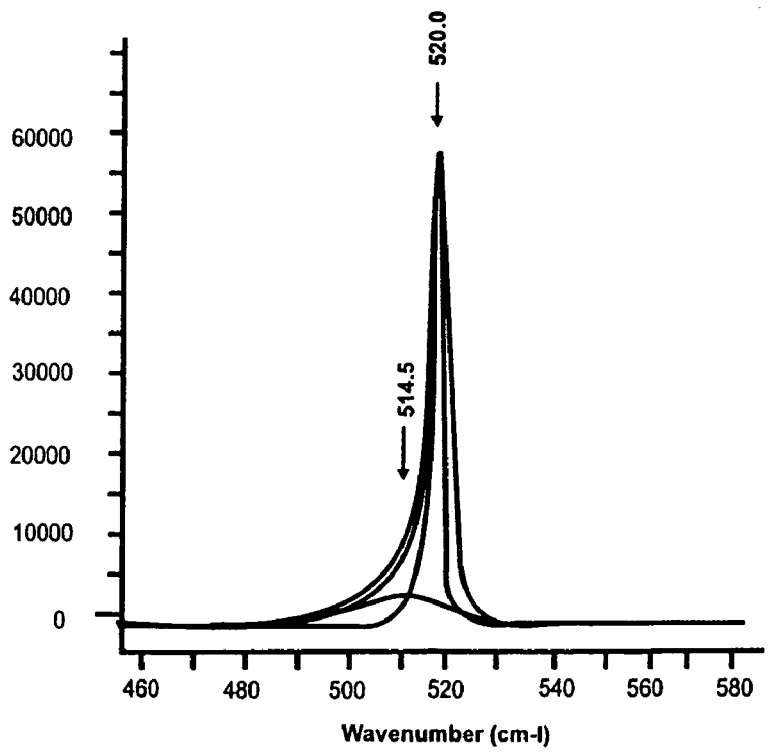
FIGURE 12. Raman Spectrum 2: "Bent Pair - 0.22% Film Strain"

$$\varepsilon_{max} = \frac{h}{2R}$$

$$\varepsilon(y) = \frac{\varepsilon_{max} y}{h/2}$$

$$\varepsilon(y) = \frac{hy}{h/2(2R)} = \frac{y}{R}$$

$$dU = E\frac{\varepsilon^2}{2}dV$$

$$U = 2\int_0^{h/2}\int_0^W\int_0^L E\frac{y^2}{R^2}\frac{1}{2}dxdwdy = \frac{E}{24R^2}LWh^3$$

Stored Energy per wafer U
let
L=w=1 meter
E = 169 Gpa
h = 1E-3 meter
R = 0.5 meter U = 28.17 Joules per m^2

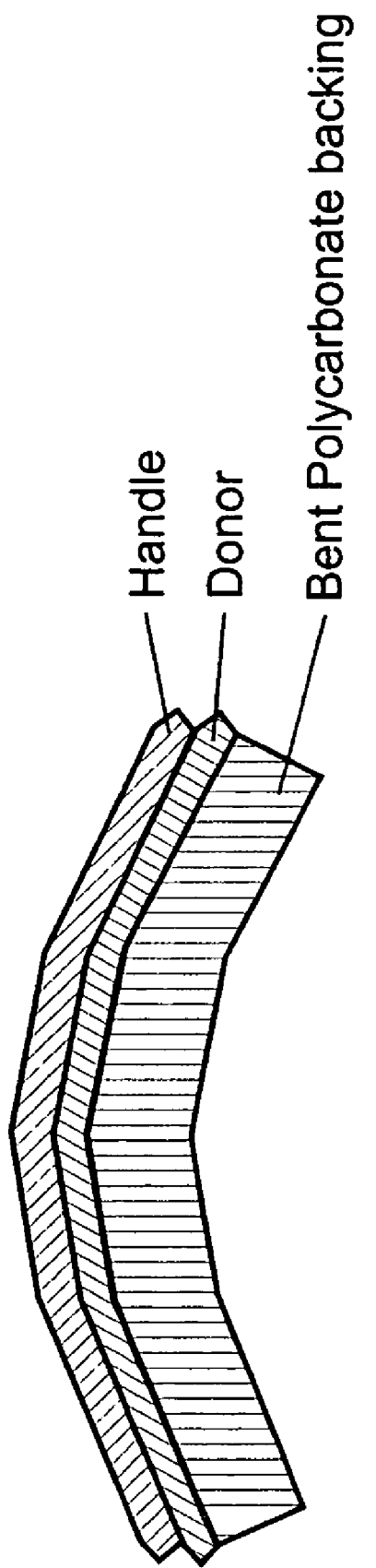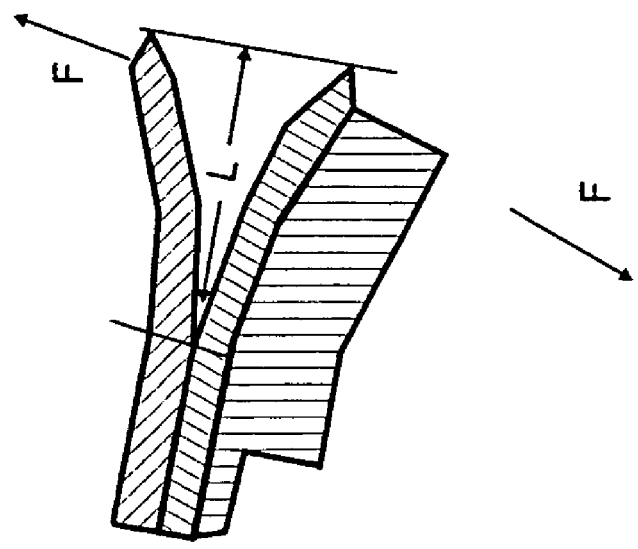
FIGURE 14

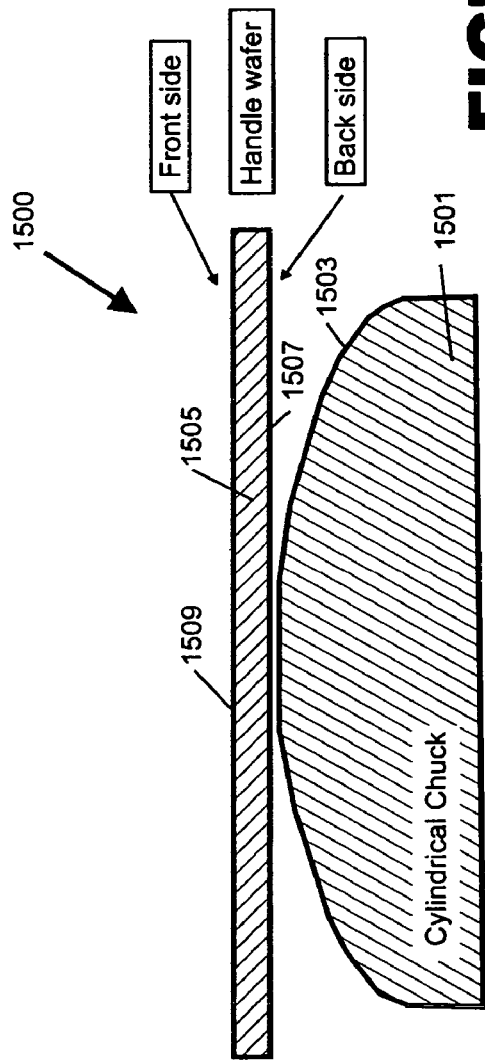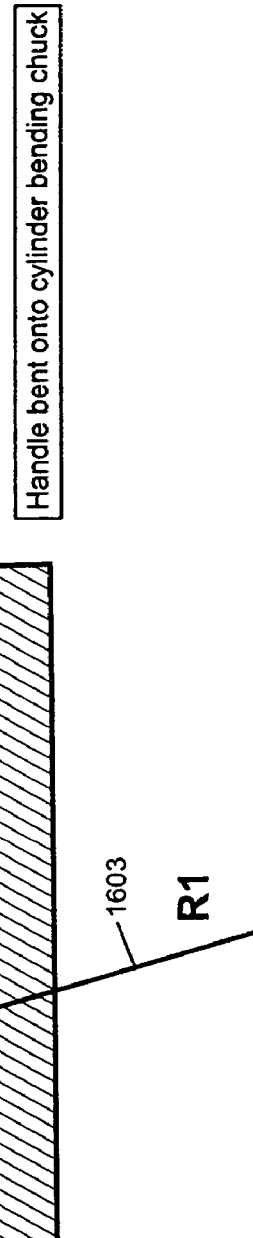

Donor wafer bent and bonded to the handle. All are attached to the bending chuck.

Lexan Polycarbonate to be affixed with silicone adhesive and porous vacuum chuck backing before being attached to the bonded pair.

Composite donor and handle with both backings attached for cleaving

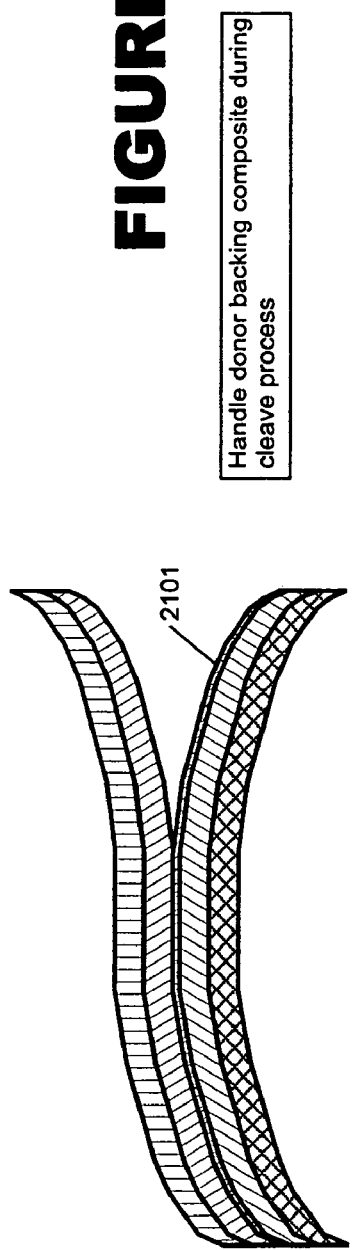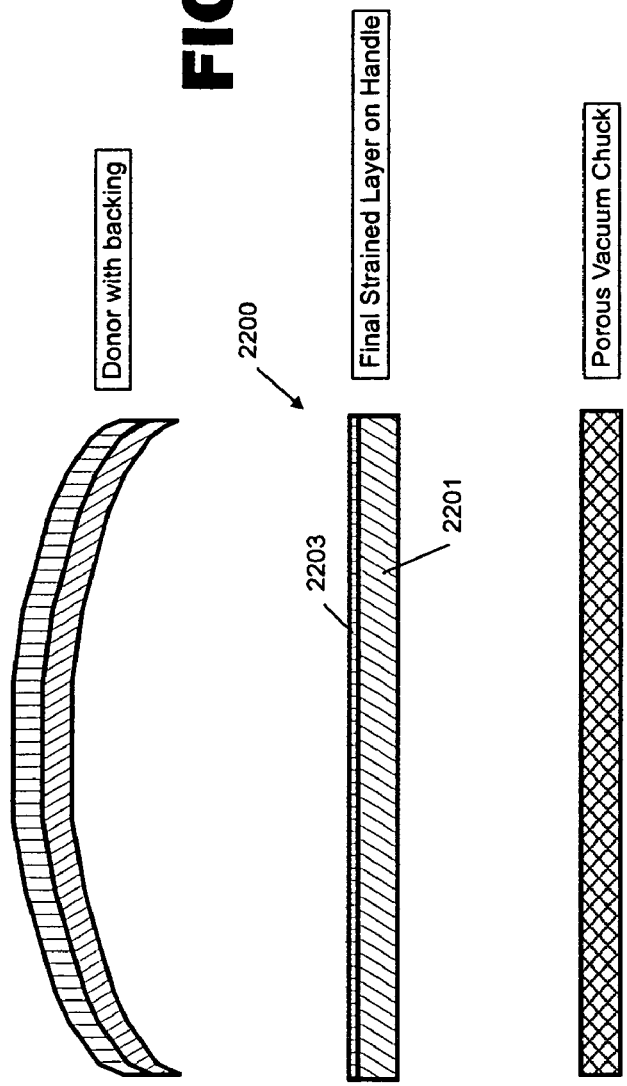

MANUFACTURING STRAINED SILICON SUBSTRATES USING A BACKING MATERIAL

BACKGROUND OF THE INVENTION

The present invention is directed to forming strained semiconductor substrates. More particularly, the invention provides a method and structures for manufacturing strained film(s) of semiconductor material using a layer transfer process and a backing material. Merely by way of example, the invention has been applied to strained silicon bearing materials for semiconductor substrates. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of such devices on conventional bulk silicon. Conventional bulk silicon has been used for numerous years. As devices become smaller, however, conventional bulk silicon has limitations. These limitations include isolation problems between transistor device structures. Additionally, conventional bulk silicon has imperfections, which lead to limitations with device speed and reliability issues. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for forming strained semiconductor substrates are provided. More particularly, the invention provides a method and structures for manufacturing strained film(s) (e.g., silicon, germanium, silicon carbide, gallium arsenide, Group III/V, silicon germanium alloy) of semiconductor material using a layer transfer process and a backing material. Merely by way of example, the invention has been applied to strained silicon bearing materials for semiconductor substrates. But it would be recognized that the invention has a much broader range of applicability.

In a specific embodiment, the present invention provides a method for forming a strained layer of semiconductor material, e.g., silicon. The method includes providing a deformable surface region having a first predetermined radius of curvature, which is defined by R(1) and is defined normal to the surface region. Preferably, a non-deformable backing plate is on and in contact on a backside of the deformable surface region. The non-deformable backing plate causing the deformable surface region to be substantially non-deformable during a cleaving process. The method includes providing a first semiconductor substrate (e.g., silicon wafer) having a first thickness. Preferably, the first semiconductor substrate has a face, a backside, and a cleave plane defined within the first thickness. The method includes a step of overlying the backside of the first substrate on a portion of the surface region having the predetermined radius of curvature to cause a first bend within the thickness of material to form a first strain within a portion of the first thickness. The method provides a second semiconductor substrate having a second thickness, which has a face and a backside. The method includes a step of overlying the face of the second semiconductor substrate on a portion of the face of the first substrate to cause a second bend within the thickness of material to form a second strain within a portion of the second thickness. A step of joining the face of the second semiconductor substrate to the face of the first substrate forms a sandwich structure while maintaining the first bend in the first substrate and the second bend in the second semiconductor substrate. Preferably, joining occurs using a low temperature process such as plasma activated bonding or the like.

The method releases a portion of a thickness of the first substrate along a vicinity of the cleave plane to free the portion of the thickness of material from a remaining portion of the first semiconductor substrate while being attached to the second substrate and while the backing material causes the portion of the thickness of material to be freed from the remaining portion in a controlled manner. The method conforms the shape of the thickness of material to the second substrate as a radius of curvature on the second substrate approaches a second predetermined radius (R2) of curvature. The method increases a magnitude of a strain from the first strain to a third strain within the thickness of material as the thickness of conforms in shape to the second substrate as the radius of curvature on the second substrate approaches the second predetermined radius of curvature. Preferably, the radius of curvature R2 approaches infinity to characterize a flat second substrate with a strained layer overlying the second substrate.

In an alternative specific embodiment, the present invention provides a method for forming a strained layer of semiconductor material. The method includes providing a deformable surface region having a first predetermined radius of curvature, which is defined by R(1) and is defined normal to the surface region. Preferably, a non-deformable backing plate is on and in contact on a backside of the deformable surface region. The non-deformable backing plate causing the deformable surface region to be substantially non-deformable during a cleaving process. The method includes providing a first semiconductor substrate (e.g., silicon wafer) having a first thickness. Preferably, the first substrate has a face and a backside. The method includes a step of overlying the backside of the first substrate on a portion of the surface region having the predetermined radius of curvature to cause a first bend within the thickness of material to form a first strain within a portion of the first thickness. The method provides a second semiconductor substrate having a second thickness, which has a face, a backside, and a cleave plane within the second thickness. The method includes a step of overlying the face of the second substrate on a portion of the face of the first semiconductor substrate to cause a second bend within the thickness of material to form a second strain within a portion of the second thickness. A step of joining the face of the second substrate to the face of the first substrate forms a sandwich structure while maintaining the first bend in the first substrate and the second bend in the second substrate. Preferably, joining uses a step of plasma activated bonding or the like.

The method releases a portion of a thickness the second semiconductor substrate along a vicinity of the cleave plane to free the portion of the thickness of material from a remaining portion of the second substrate while being attached to the first substrate, which is maintained on the backing material. The method conforms the shape of the thickness of material to the first substrate as a radius of curvature on the first substrate approaches a second predetermined radius (R2) of curvature. The method increases a magnitude of a strain from the first strain to a third strain within the thickness of material as the thickness of conforms in shape to the first substrate as the radius of curvature on the first substrate approaches the second predetermined radius of curvature. Preferably, the radius of curvature R2 approaches infinity to characterize a flat first substrate with a strained layer overlying the first substrate. In a specific embodiment, the method couples the backside of the second substrate to a second backing plate to cause the second substrate to be substantially non-deformable in an optional step.

In yet an alternative specific embodiment, the present invention provides a system for forming a strained layer of semiconductor material. The system includes a deformable surface region having a first predetermined radius of curvature. Preferably, the first predetermined radius of curvature is defined by R(1) and is defined normal to the surface region. Preferably, a non-deformable backing plate is on and in contact on a backside of the deformable surface region. The non-deformable backing plate causing the deformable surface region to be substantially non-deformable during a cleaving process. The system also includes a first substrate having a first thickness. The first substrate has a face, a backside, and a cleave plane within the first thickness. The first substrate is overlying the backside of the first substrate on a portion of the surface region having the predetermined radius of curvature to cause a first bend within the thickness of material to form a first strain within a portion of the first thickness. A second semiconductor substrate having a second thickness. The second substrate has a face and a backside. The second substrate is overlying the face of the second substrate on a portion of the face of the first substrate to cause a second bend within the thickness of material to form a second strain within a portion of the second thickness, whereupon the face of the second substrate is joined to the face of the first substrate to form a sandwich structure while maintaining the first bend in the first substrate and the second bend in the second substrate. The first substrate includes a portion of a thickness that is released along a vicinity of the cleave plane to free the portion of the thickness of material from a remaining portion of the first substrate while being attached to the second substrate and the thickness of material conforms to a shape of the second substrate as a radius of curvature on the second substrate approaches a second predetermined radius (R2) of curvature thereby increasing a magnitude of a strain from the first strain to a third strain within the thickness of material as the thickness of conforms in shape to the second substrate as the radius of curvature on the first substrate approaches the second predetermined radius of curvature. Alternatively, the cleave plane can be within the second substrate, depending upon the specific embodiment.

Still further, the present invention provides a method for fabricating a semiconductor substrate. The method includes providing a handle substrate in a planar configuration. In a preferred embodiment, the handle substrate has a back side and a face. The method includes conforming the backside of the handle substrate to an annular bending member (e.g., cylindrical, curved surface with fixed radius), which is characterized by a first radius of curvature to cause the handle substrate to be in an annular configuration. The method includes providing a donor substrate, which has a face, a thickness of material coupled to the face, a cleave region defining the thickness of material, and a backside. The method includes joining the face of the donor substrate to the face of the handle substrate, while the handle substrate has been maintained on the annular bending member, to cause strain within at least the thickness of material of the donor substrate. The method also couples a backing plate overlying the backside of the donor substrate. In a preferred embodiment, the backing plate conforms to a shape of the backside of the donor substrate. The method initiates removal of the thickness of material from the donor substrate by causing a cleaving action within a portion of the cleave region of the donor substrate, while the backing plate has been maintained on the donor substrate. The method also transfers the thickness of material from the donor substrate to the handle substrate, while the annular bending member remains coupled to the handle substrate. The method detaches the handle substrate, including the thickness of material in a strained state, from the annular bending member to cause an additional strain to the thickness of material as the handle substrate, including the thickness of material changes in shape from the annular configuration to the planar configuration.

Depending upon the specific embodiment, one or more of these features may also be included.

1. Plasma activated-bonding of the wafer occurs in certain embodiments. Here, bonding would be uniaxial (e.g., cylindrically curved, having a fixed radius) or conical (e.g., biaxially curved, having a fixed radius). Essentially, any shape selected allows a desired stress distribution on the final film. Given the following relationship, the bending imparts a strain (epsilon) of h/(2*R) where h=wafer thickness and R=bend radius. For 0.2% strain for example, the stress is Young's modulus (E) at the desired direction * strain. For <110> direction in silicon, E=169 GPa, for <100>, E=130 GPa. For a 0.2% strain at <110>, the stress is about 340 MPa. Note that the example would be to bend the donor convex to cause 340 MPa tensile and the handle is bonded onto this donor in the corresponding concave shape (340 MPa compressive). When bonded and clamped, the bond does not see any shear stresses since the forces are held and taken up by the clamping jig. Once the bond treatment (BT) is completed, the handle concave wafer can be unclamped and "peeled" off the donor where the handle now has the cleaved film attached to it. Once this handle wafer springs back flat, it adds another 340 MPa tensile stress to the film which would now be 2* 340 MPa or 680 MPa. The handle/donor shape therefore doubles the stress seen at the wafer surfaces when the film is cleaved and the handle wafer is allowed to spring back to its original flat shape. Note that a reverse compressive film stress is possible by having the handle be convex while the donor is concave.

2. According to a specific embodiment, release of the film of material occurs using a controlled cleaving process ("CCP"). Controlled cleaving is described in U.S. Pat. No. 6,013,563, commonly assigned, and hereby incorporated by reference for all purposes. The controlled cleaving process can be used on a curved wafer pair according to a specific embodiment. According to other embodiments, which also may be controlled, would include releasing the film of material using a processed commonly called Smart-Cut™ of Soitec SA of France. Still further other techniques for cleaving such as ELTRAN™ from Canon, Inc. Of course, one of ordinary skill in the art would recognize other variations, alternatives, and modifications.

3. Additionally, clamping the wafer pair occurs so the bond treatment is made with the bond interface that is essentially free of shear stress according to a specific embodiment. If the wafers are bonded curved and bond treatment (e.g., thermal treatment) is provided without clamping, certain stresses may degrade the bond and perhaps contribute to voids, debonds, and other bond failure mechanisms.

4. Depending upon the embodiment, the present method can be cluster tool compatible. Such cluster tool includes combining the plasma-activation and curved bonding in a tool where the result is a clamped or unclamped wafer pair that has the stresses within the wafer of a desired sign and magnitude.

5. Optionally, the joined substrates can be clamped using a jig, which can include the sandwich structure while being subjected to thermal treatment. In a specific embodiment, a cylindrical or conical shape structure forms certain stresses on the substrates and also can be used to provide heat (similar to a hot plate). Here, the substrates can be mounted on this chuck that would go through a heat cycle on the stressing jig itself. Preferably, faster ramp up and cool down cycles occur to provide a selected thermal profile. If the thermal profile is correctly selected, efficient thermal cycling occurs according to a specific embodiment.

Other benefits are achieved by way of the present invention over conventional techniques. For example, the present technique provides an easy to use process that relies upon conventional technology. In some embodiments, the method may provide higher device yields in dies per wafer. Additionally, the method provides a process that is compatible with conventional process technology without substantial modifications to conventional equipment and processes. Preferably, the method provides for certain regions of silicon that strained using a novel support member or curved surface region having a predetermined radius of curvature. More preferably, the invention provides a resulting thin film structure, which has been strained, that is substantially free from dislocations, and other imperfections. Preferably, the invention provides for strained silicon-on-silicon structures that substantially reduces threading dislocation density (TDD) issues. Additionally, the invention provides a resulting substrate with strain that is unlikely to relax for any area size while the strain may relax for conventional strained SOI areas during subsequent integrated circuit processing, which often requires high temperatures. If an intervening dielectric layer is present between the cleaved film and the handle substrate, a strained silicon on insulator (SSOI) structure can also be fabricated with similar defect density and quality advantages. In each of these structures, a feature of this invention allows the film to be strained uniaxially or biaxially. The film strain can also be selected to be compressive or tensile. Additionally, the present invention provides a resulting structure substantially free from underlying dislocation rich germanium bearing layers or other undesirable impurities that may lead to problems with device quality and/or reliability. A substantially planar strained material (e.g., silicon) surface may also be achieved using the present invention. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 9 through 12 illustrate experimental results according to embodiment of the present invention;

FIGS. 13 through 14 illustrate experimental results according to alternative embodiments of the present invention; and FIGS. 15 through 23 illustrate a method for forming a strained silicon substrate according to a preferred embodiment of the present invention.

DETAILED DESCRIPTION OF THE INVENTION

Figure 1:
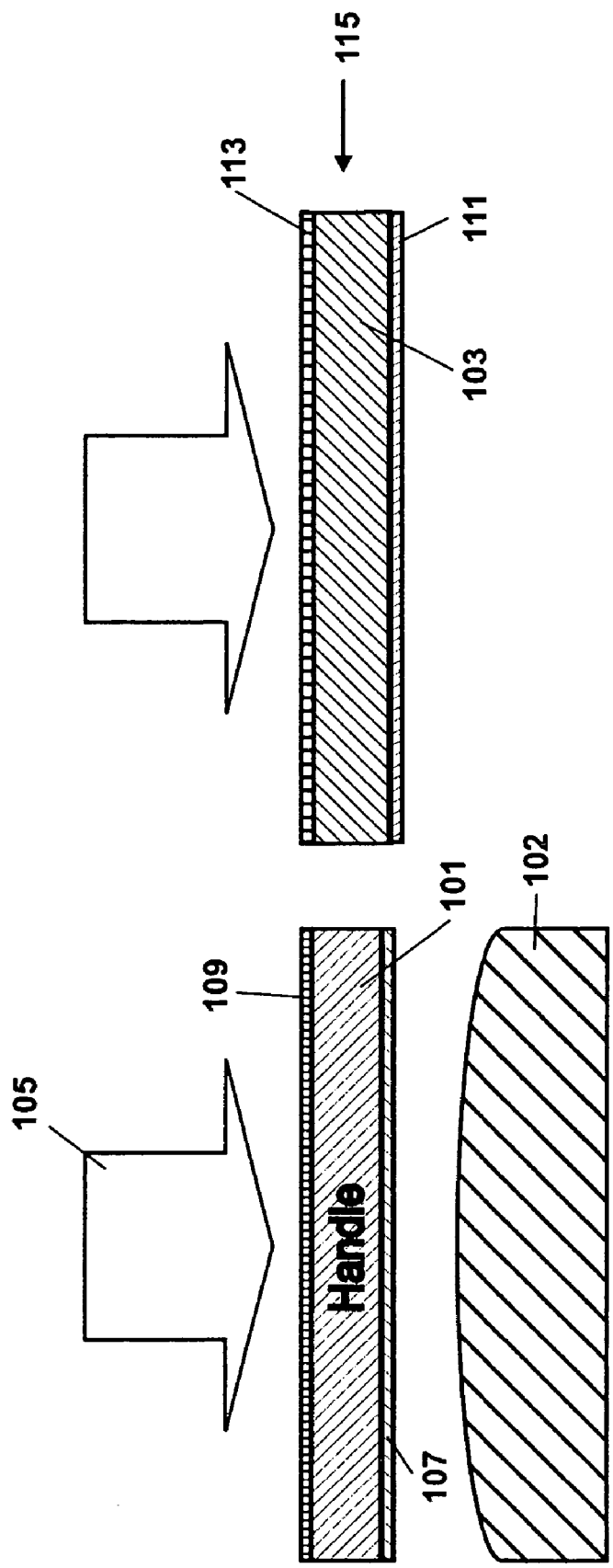
FIGS. 1 through 4 and 4A illustrate a method of forming a strained substrate according to an embodiment of the present invention.

According to the present invention, techniques for forming strained semiconductor substrates are provided. More particularly, the invention provides a method and structures for manufacturing strained film(s) (e.g., silicon, germanium, silicon carbide, gallium arsenide, Group III/V, silicon germanium alloy) of semiconductor material using a layer transfer process and a backing material. Merely by way of example, the invention has been applied to strained silicon bearing materials for semiconductor substrates. But it would be recognized that the invention has a much broader range of applicability.

An method of manufacturing a strained layer on a semiconductor substrate is briefly outlined below.

1. Provide a deformable surface region having a first predetermined radius of curvature, which is defined by R(1) and is defined normal to the surface region;
2. Couple the deformable surface region to a backing plate that causes the deformable surface to be substantially non-deformable;
3. Provide a first substrate having a first thickness, a face, and a backside;
4. Overlie the backside of the first substrate on a portion of the surface region having the predetermined radius of curvature to cause a first bend within the thickness of material to form a first strain within a portion of the first thickness;
5. Provide a second substrate having a second thickness, a face, a backside, and a cleave plane within the second thickness;
6. Overlie the face of the second substrate on a portion of the face of the first substrate to cause a second bend within the thickness of material to form a second strain within a portion of the second thickness;
7. Join the face of the second substrate to the face of the first substrate to form a sandwich structure while maintaining the first bend in the first substrate and the second bend in the second substrate; and
8. Release a portion of a thickness of the second substrate along a vicinity of the cleave plane to free the portion of the thickness of material from a remaining portion of the second substrate while being attached to the first substrate and the backing plate; and 9. Conform the shape of the thickness of material to the first substrate as a radius of curvature on the first substrate approaches a second predetermined radius (R2) of curvature;

10. Increase a magnitude of a strain from the first strain to a third strain within the thickness of material as the thickness of conforms in shape to the first substrate as the radius of curvature on the first substrate approaches the second predetermined radius of curvature; and 11. Perform other steps, as desired.

The above sequence of steps provides a method according to an embodiment of the present invention. As shown, the method uses a combination of steps including a way of forming a strained silicon layer overlying a handle substrate. Other alternatives can also be provided where steps are added, one or more steps are removed, or one or more steps are provided in a different sequence without departing from the scope of the claims herein. Further details of the present method can be found throughout the present specification and more particularly below.

FIGS. 1 through 4 illustrate a method of forming a strained silicon substrate according to an embodiment of the present invention. These diagrams are merely examples, which should not unduly limit the scope of the claims herein. One of ordinary skill in the art would recognize other variations, modifications, and alternatives. As shown, the method is directed to forming a strained layer of semiconductor material, e.g., silicon. The method includes providing a non-deformable surface region 102 having a first predetermined radius of curvature, which is defined by R(1) and is defined normal to the surface region. Preferably, the first radius of curvature is defined by an imaginary circle, which is continuous or variable across a surface of the substrate. There can be other variations, modifications, and alternatives.

Figure 2:
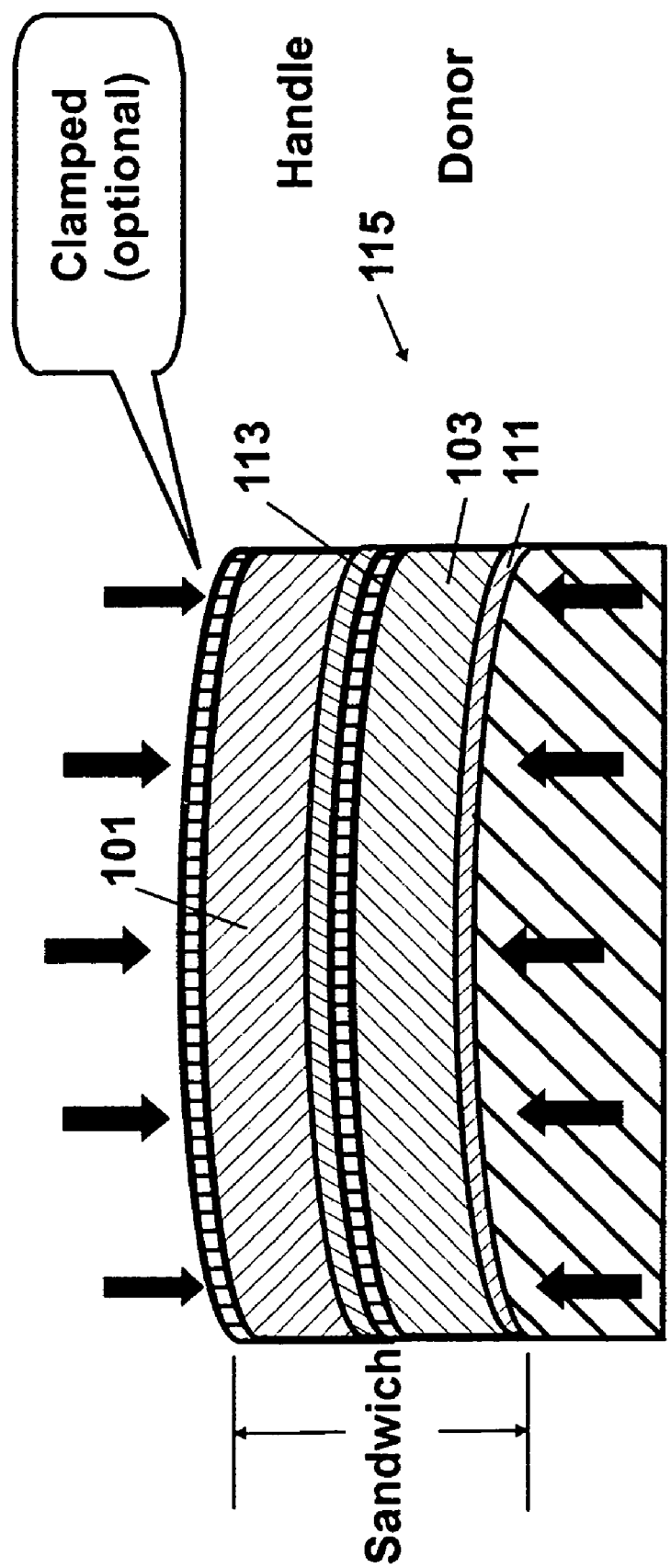

The method includes providing a first substrate (e.g., silicon wafer) 103 having a first thickness. Preferably, the first substrate has a face 113, a backside 111, and a cleave plane 115 defined within the first thickness as illustrated by FIG. 1. Preferably, the cleave plane is formed within the first thickness slightly below the face. A distance between the face and the cleave plane is a predetermined thickness, which serves as a device layer in later processes. The method includes a step of overlying the backside of the first substrate on a portion of the surface region having the predetermined radius of curvature to cause a first bend within the thickness of material to form a first strain within a portion of the first thickness, as illustrated by FIG. 2. The method provides a second substrate 101 having a second thickness, which has a face 109 and a backside 107. The method includes a step of overlying the face of the second substrate on a portion of the face of the first substrate to cause a second bend within the thickness of material to form a second strain within a portion of the second thickness. As shown, the donor substrate portion within the vicinity of the bond interface is stained via tensile mode.

A step of joining the face of the second substrate to the face of the first substrate forms a sandwich structure while maintaining the first bend in the first substrate and the second bend in the second substrate. Preferably, joining occurs using a low temperature process such as plasma activated bonding 105 or the like. In a specific embodiment, the plasma activated bonding is maintained at less than 1000 degrees Celsius or less than 500 degrees Celsius. Bonding can occur via silicon dioxide surface or silicon to silicon surfaces depending upon the embodiment. Other types of bonding include, but are not limited to, glue layers, adhesives, spin on glass layers, etc. Depending upon the embodiment, the joining is a rolling process that physically mates the face of the second substrate to the face of the first substrate using a rolling action defined by an axis formed between a separated region between the face of the second substrate and the face of the first substrate and a connected region between the face of the second substrate and the face of the first substrate. The handle substrate portion within the vicinity of the bond interface is strained via compression mode. Of course, there can be other variations, modifications, and alternatives.

Figure 3:
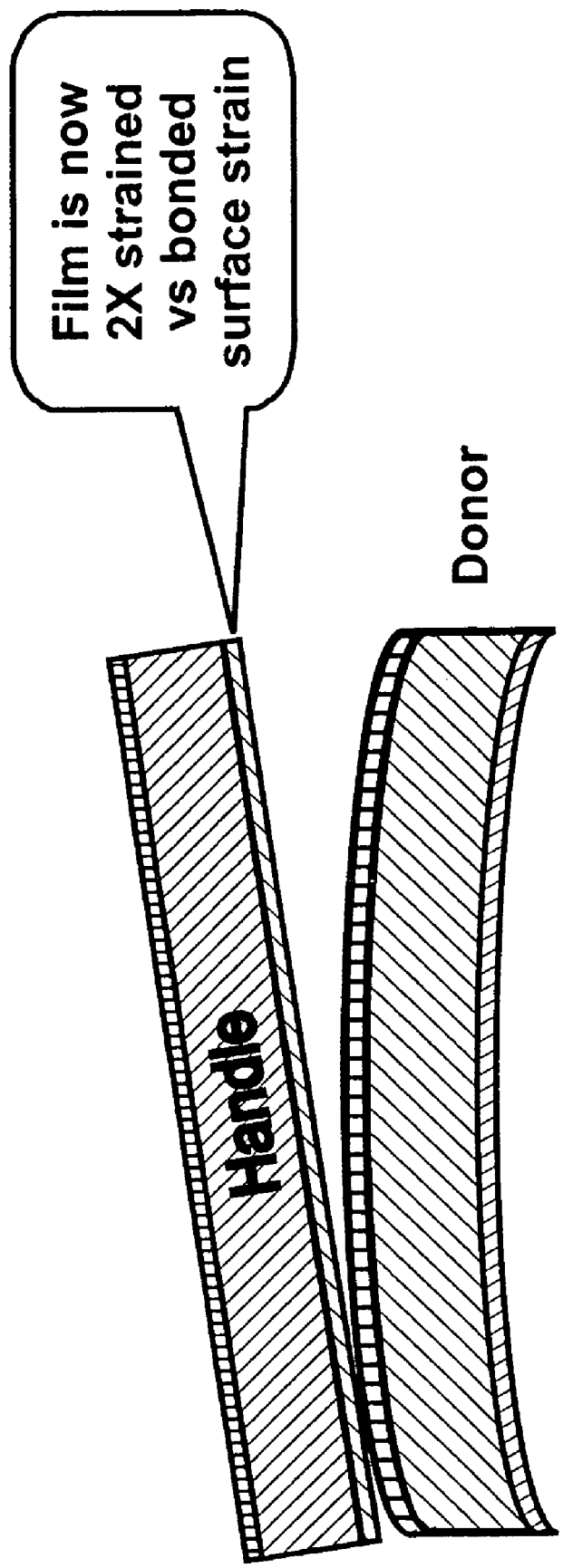

In a specific embodiment, the method includes performing a bond treatment to finish the joining of the first substrate and the second substrate, as shown in FIG. 2. The bond treatment can be any suitable technique such as thermal annealing, and the like. Referring to FIG. 3, the method includes releasing a portion of a thickness the second substrate along a vicinity of the cleave plane to free the portion of the thickness of material from a remaining portion of the first substrate while being attached to the second substrate. In a specific embodiment, releasing occurs using a controlled cleaving process, such as the noted above. In another embodiment, the releasing can occur using a process commonly called the Smart Cut™ process marketed by Soitec SA of France. Another technique can be a process called ELTRAN™ process marketed by Canon, Inc. Any combinations of these processes can also be used depending upon the embodiment.

Figure 4:
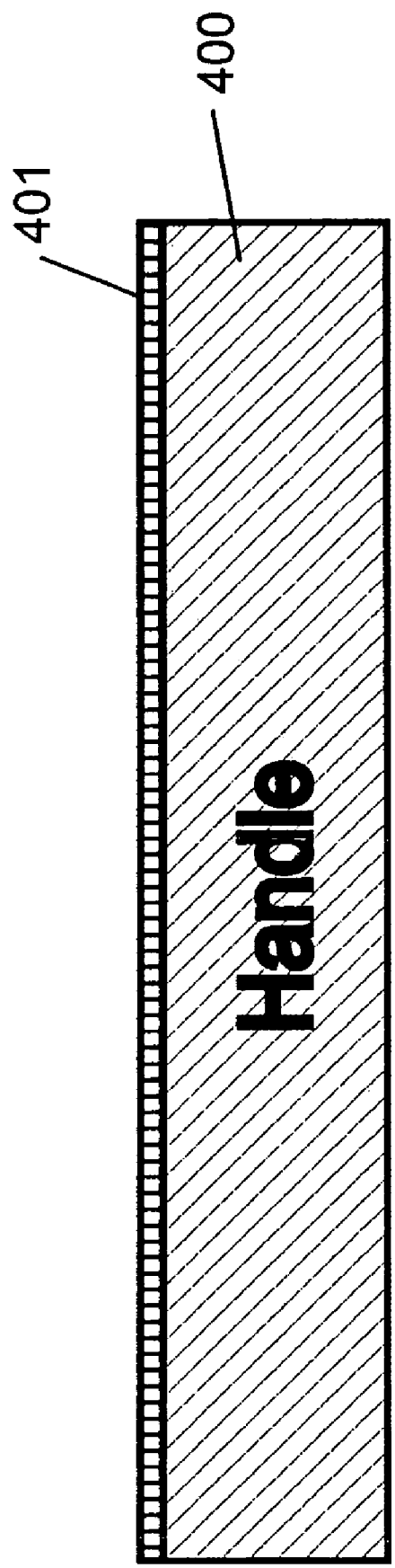

The method conforms the shape of the thickness of material to the second substrate as a radius of curvature on the second substrate approaches a second predetermined radius (R2) of curvature. Preferably, the second radius of curvature is defined by infinity, which is where the substrate is essentially flat and free from any bends. The method increases a magnitude of a strain from the first strain to a third strain within the thickness of material as the thickness of conforms in shape to the second substrate as the radius of curvature on the second substrate approaches the second predetermined radius of curvature. Preferably, the radius of curvature R2 approaches infinity to characterize a flat second substrate with a strained layer overlying the second substrate, as illustrated in FIG. 4. As shown, the second substrate 400 includes an overlying strained layer 401, which preferably includes a magnitude of strains from the first bend and the re-bend back to the flat shape structure according to a specific embodiment. Certain details of how the strain can be additive are illustrated throughout the present specification and more particularly below.

Figure 4A:
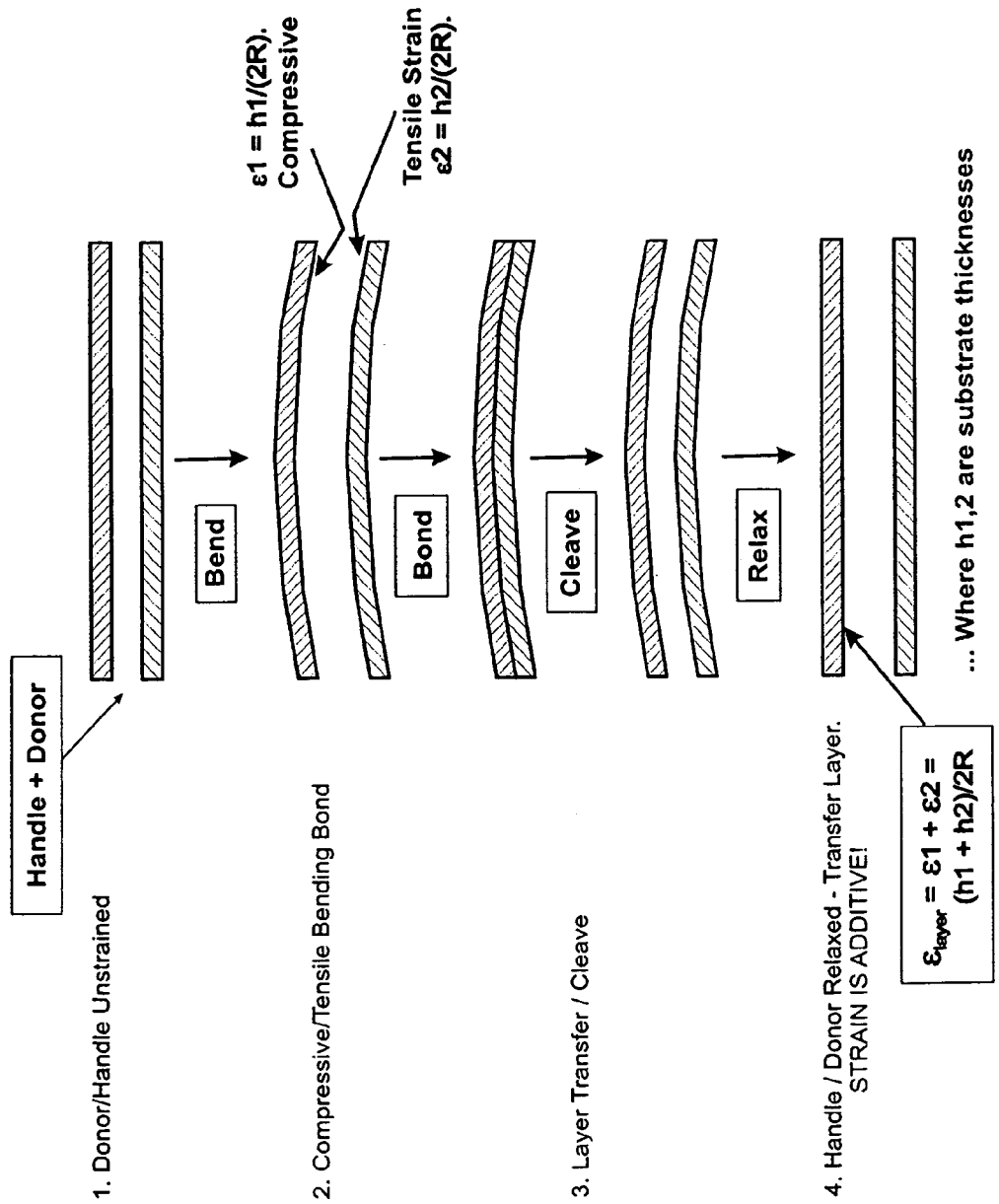

In a specific embodiment, the present method provides for a uniaxial strained silicon layer formed by a "bend before bond" step, as illustrated in FIG. 4A. As shown, the method includes providing a handle and donor substrate, step 1. The method provides stain to the donor substrate by bending it in a predetermined manner. The method then bonds the bent donor substrate to a handle substrate, which may also be bent in a similar manner, as illustrate by step 2. The method performs a layer transfer or cleave process, which removes a portion of the donor substrate that has been attached to the handle substrate, as shown in step 3. The method then relaxes the handle and detached donor substrate, which illustrates that the strain is additive in a specific embodiment. The additive strain can be described in the relationships provided below.

$$\epsilon_{layer} = \epsilon 1 + \epsilon 2 = (h1 + h2)/2R$$

where:
$R = R1 = R2$ radius of bend;
$h1$ = handle substrate thickness;
$h2$ = donor substrate thickness;
$\epsilon 1 = h1/(2R)$ = strain in handle substrate;
$\epsilon 2 = h2/(2R)$ = strain in donor substrate; and $\epsilon_{layer}$=total strain.

The relationships above are merely examples and should not unduly limit the scope of the claims herein. One of ordinary skill in the art would recognize many other variations, modifications, and alternatives.

The above sequence of steps provides a method according to an embodiment of the present invention. As shown, the method uses a combination of steps including a way of forming a strained silicon layer overlying a handle substrate. Other alternatives can also be provided where steps are added, one or more steps are removed, or one or more steps are provided in a different sequence without departing from the scope of the claims herein.

An alternative method of manufacturing a strained silicon layer on a semiconductor substrate is briefly outlined below.

1. Provide a non-deformable surface region having a first predetermined radius of curvature, which is defined by R(1) and is defined normal to the surface region;
2. Provide a first substrate having a first thickness, a face, a backside, and a cleave plane defined within the first thickness;
3. Overlie the backside of the first substrate on a portion of the surface region having the predetermined radius of curvature to cause a first bend within the thickness of material to form a first strain within a portion of the first thickness;
4. Provide a second substrate having a second thickness, a face, and a backside;
5. Overlie the face of the second substrate on a portion of the face of the first substrate to cause a second bend within the thickness of material to form a second strain within a portion of the second thickness;
6. Join the face of the second substrate to the face of the first substrate to form a sandwich structure while maintaining the first bend in the first substrate and the second bend in the second substrate; and
7. Release a portion of a thickness the first substrate along a vicinity of the cleave plane to free the portion of the thickness of material from a remaining portion of the first substrate while being attached to the second substrate; and
8. Conform the shape of the thickness of material to the second substrate as a radius of curvature on the second substrate approaches a second predetermined radius (R2) of curvature;
9. Increase a magnitude of a strain from the first strain to a third strain within the thickness of material as the thickness of conforms in shape to the second substrate as the radius of curvature on the second substrate approaches the second predetermined radius of curvature; and
10. Perform other steps, as desired.

The above sequence of steps provides a method according to an embodiment of the present invention. As shown, the method uses a combination of steps including a way of forming a strained silicon layer overlying a handle substrate. Other alternatives can also be provided where steps are added, one or more steps are removed, or one or more steps are provided in a different sequence without departing from the scope of the claims herein. Further details of the present method can be found throughout the present specification and more particularly below.

FIGS. 5 through 8 illustrate a method of forming a strained substrate according to an alternative embodiment of the present invention. These diagrams are merely examples, which should not unduly limit the scope of the claims herein. One of ordinary skill in the art would recognize other variations, modifications, and alternatives. As shown, the method is directed to forming a strained layer of semiconductor material, e.g., silicon. The method includes providing a non-deformable surface region 102 having a first predetermined radius of curvature, which is defined by R(1) and is defined normal to the surface region. Preferably, the first radius of curvature is defined by an imaginary circle, which is continuous or variable across a surface of the substrate. There can be other variations, modifications, and alternatives.

Figure 5:
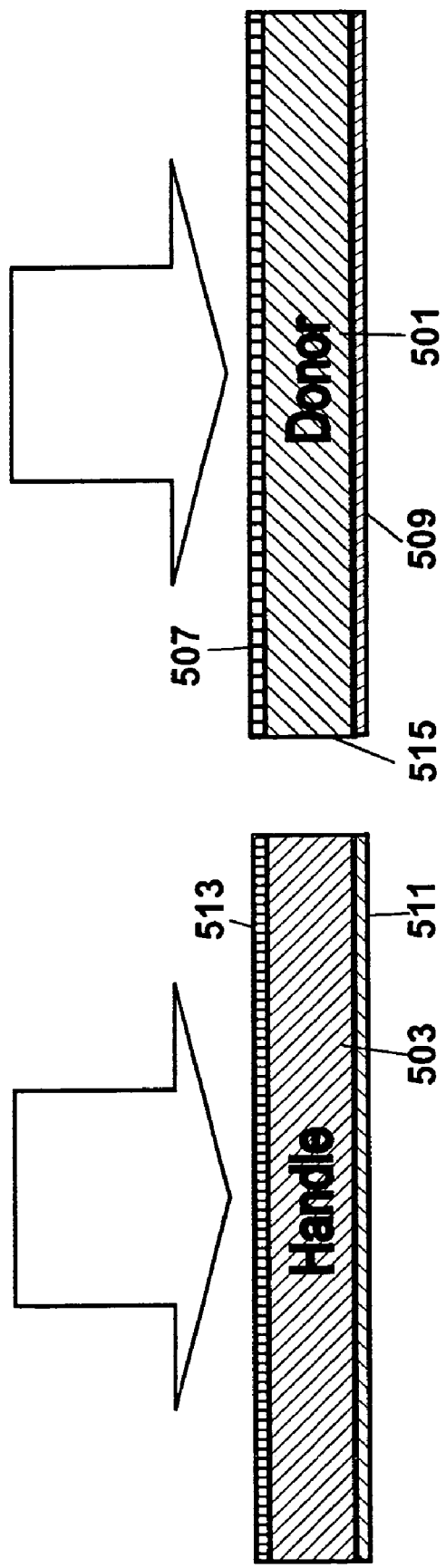
FIGS. 5 through 8 illustrate a method of forming a strained substrate according to an alternative embodiment of the present invention.
Figure 6:
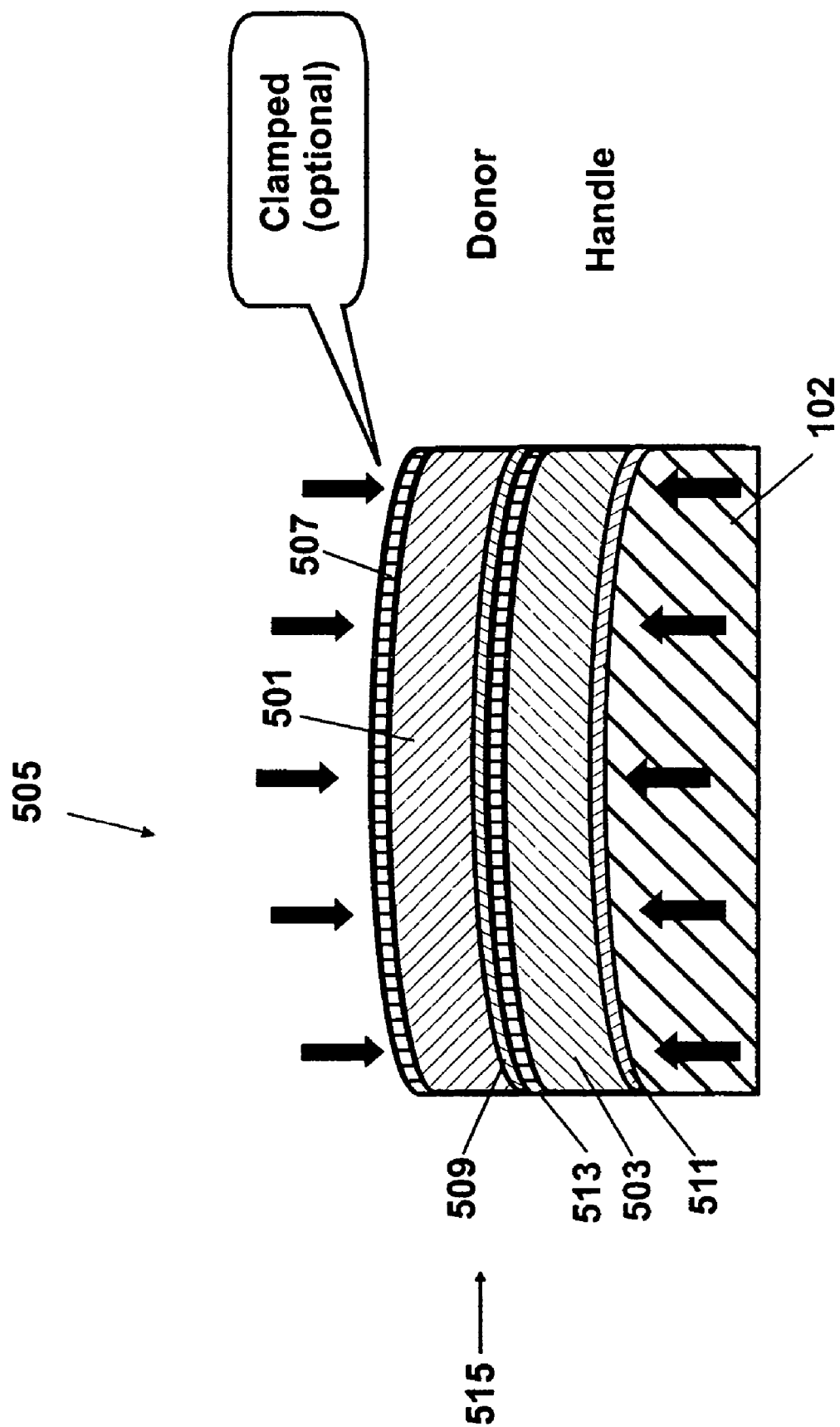

The method includes providing a first substrate (e.g., silicon wafer) 503 having a first thickness. Preferably, the first substrate has a face 513 and a backside 511 as illustrated by FIG. 5. The method includes a step of overlying the backside of the first substrate on a portion of the surface region having the predetermined radius of curvature to cause a first bend within the thickness of material to form a first strain within a portion of the first thickness, as illustrated by FIG. 6. The method provides a second substrate 501 having a second thickness, which has a face 509, a backside 507, and a cleave plane 515 defined within the second thickness. The method includes a step of overlying the face of the second substrate on a portion of the face of the first substrate to cause a second bend within the thickness of material to form a second strain within a portion of the second thickness. As shown, the donor substrate portion within the vicinity of the bond interface is strained via compressive mode.

A step of joining the face of the second substrate to the face of the first substrate forms a sandwich structure while maintaining the first bend in the first substrate and the second bend in the second substrate. Preferably, joining occurs using a low temperature process such as plasma activated bonding 505 or the like. In a specific embodiment, the plasma activated bonding is maintained at less than 1000 degrees Celsius or less than 500 degrees Celsius. Bonding can occur via silicon dioxide surface or silicon to silicon surfaces depending upon the embodiment. Other types of bonding include, but are not limited to, glue layers, etc. Depending upon the embodiment, the joining is a rolling process that physically mates the face of the second substrate to the face of the first substrate using a rolling action defined by an axis formed between a separated region between the face of the second substrate and the face of the first substrate and a connected region between the face of the second substrate and the face of the first substrate. The handle substrate portion within the vicinity of the in bond interface is trained via compression mode. Of course, there can be other variations, modifications, and alternatives.

Figure 7:
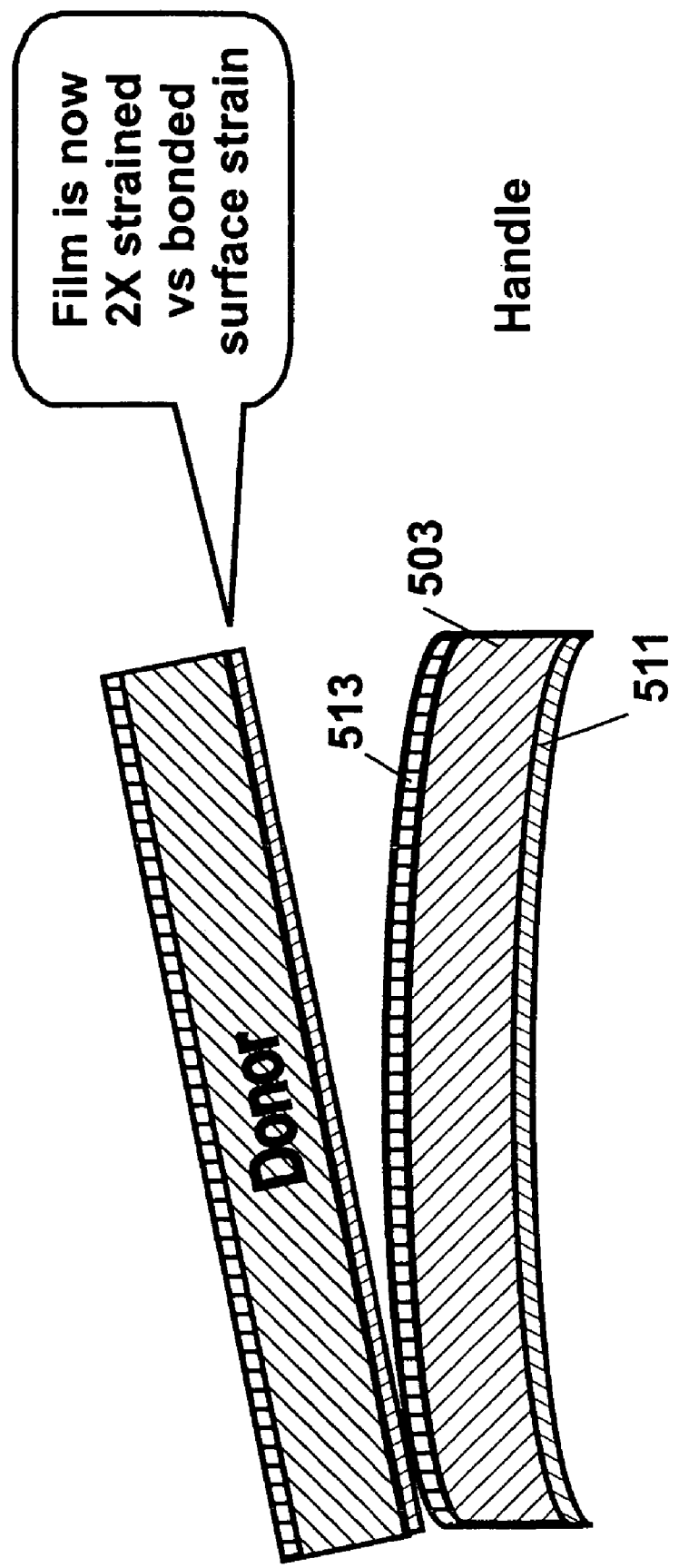

In a specific embodiment, the method includes performing a bond treatment to finish the joining of the first substrate and the second substrate. The bond treatment can be any suitable technique such as thermal annealing, and the like. Referring to FIG. 7, the method includes releasing a portion of a thickness of the second substrate along a vicinity of the cleave plane to free the portion of the thickness of material from a remaining portion of the second substrate while being attached to the first substrate. In a specific embodiment, releasing occurs using a controlled cleaving process, such as the noted above. In another embodiment, the releasing can occur using a process commonly called the Smart Cut™ process marketed by Soitec SA of France. Another technique can be a process called ELTRAN™ process marketed by Canon, Inc. Any combination of these processes can also be used.

Figure 8:
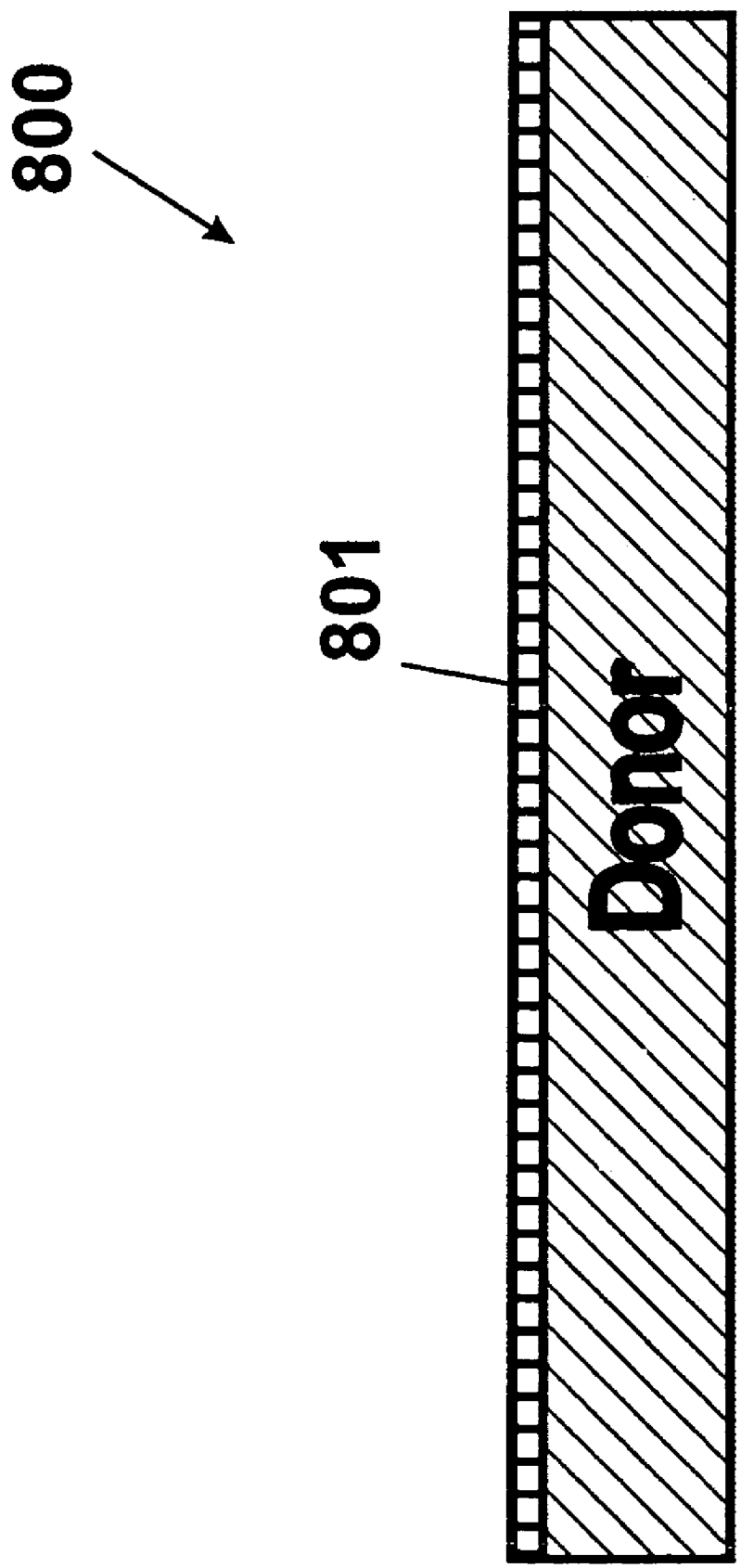

The method conforms the shape of the thickness of material to the first substrate as a radius of curvature on the first substrate approaches a second predetermined radius (R2) of curvature. Preferably, the second radius of curvature is defined by infinity, which is where the substrate is essentially flat and free from any bends. The method increases a magnitude of a strain from the first strain to a third strain within the thickness of material as the thickness of conforms in shape to the second substrate as the radius of curvature on the first substrate approaches the second predetermined radius of curvature. Preferably, the radius of curvature R2 approaches infinity to characterize a flat first substrate with a strained layer overlying the second substrate, as illustrated in FIG. 8. As shown, the second substrate 800 includes an overlying strained layer 801, which preferably includes a magnitude of strains from the first bend and the re-bend back to the flat shape structure according to a specific embodiment.

The above sequence of steps provides a method according to an embodiment of the present invention. As shown, the method uses a combination of steps including a way of forming a strained silicon layer overlying a handle substrate. Other alternatives can also be provided where steps are added, one or more steps are removed, or one or more steps are provided in a different sequence without departing from the scope of the claims herein.

EXAMPLES

To prove the principle and operation of the process invention, experiments have been performed. These experiments are not intended to limit the spirit and scope of the invention as defined by the claims herein. One of ordinary skill in the art would recognize other variations, modifications and alternatives. In the experiments, 200 mm <100> polished silicon wafers (725 μ thick, 6-9 ohm-cm P-type Boron doped) were used. A set of wafers were deposited with a 1 μ boron doped epitaxial silicon layer of ~10Ω-cm, oxidized to an oxide thickness of 400 Å to 1000 Å and then implanted with hydrogen ions at an energy and dose in a range of 60 KeV to 80 KeV and a dose of 6.0 to 6.5E16/cm², respectively.

Wafers identified as the first substrate (epitaxial deposition/oxidized/implanted wafers) were diced into 2.5 cm (W)× 7.0 cm (L) strips and then backgrinded to a final thickness of 340 μm. Whereas, a second group of wafers, identified as the second substrate (bare silicon substrate) were diced into 2.5 cm×5.5 cm strips, but no backgrind. The strips were diced with the length being in the <110> direction. The group of strips was then plasma activated using a dual frequency plasma-activation process. A strip from first substrate was then manually set and clamped into a bonding fixture (see FIG. 9) face up with a predetermined radius of curvature (24.2 cm) which was designed to yield a surface of approximately 0.07% strain. A strip from the second substrate was then placed face down onto the first substrate. The predetermined radius is maintained and designed to impart strain on the second surface of 0.15% strain. Following the bonding steps, the assembly was placed in an oven for a final bake treatment of approximately 300° C. to 350° C. for 1 hour. After the bake treatment, the second substrate is unclamped while initiating a controlled cleave process to peel off the engineered cleave layer off the first substrate.

After the room temperature controlled cleave process, the expected measured strain is the sum of the two induced strain or 0.22%. In crystalline silicon, the Young's or elastic modulus E is anisotropic, meaning that it's value is direction dependent. For example, for three major directions <100>, <110> and <111> E varies as follows:

$E_{<100>} = 130$ GPa
$E_{<110>} = 169$ GPa
$E_{<111>} = 187$ GPa,

Where E is given by $E=\sigma/\epsilon$, the ratio of stress to strain in the elastic regime. Therefore the expected tensile stress for a layer of silicon strained expansively 0.22% in the <110> direction would be approximately 372 MPa.

Strain can be measured by standard Raman spectroscopy measurement techniques. The shift in wavenumbers (cm$^{-1}$) for silicon has been calibrated to approximately 500 MPa (tensile stress is a reduction in wavenumber while a compressive stress is an increase in wavenumber). From the experiments, the samples measured strain of 400±75MPA. Table 1 below shows the results of the measured wavenumbers on a bare silicon substrate, a control strip and the bent strip of silicon subjected to a predetermined radius of curvature of 24.2 cm.

TABLE 1

Raman Measurements

| Measurement # | Sample | Spectrum # | Si Peak (cm − 1) | Delta Si Peak (cm − 1) | Implant Damage Peak (cm − 1) |
|---|---|---|---|---|---|
| 1 | EAG Si Reference | Si-1 | 520.7 | 0 | n/a |
| 2 | Sample #1 ("Flat" Bonding Reference) | 1 | 520.8 (520.820) | 0 | 514.3 (514.297) |
| 3 | Sample #2 ("Bent Pair - 0.22% Film Strain") | 2 | 520.0 (520.033) | −0.8 | 514.5 (514.576) |

From the Raman measurement (see FIGS. 10 through 12) and analysis, there is very good agreement of the expected and measurement strained value as explained by the invention. Of course, there can be other variations, modifications, and alternatives.

Figure 13:
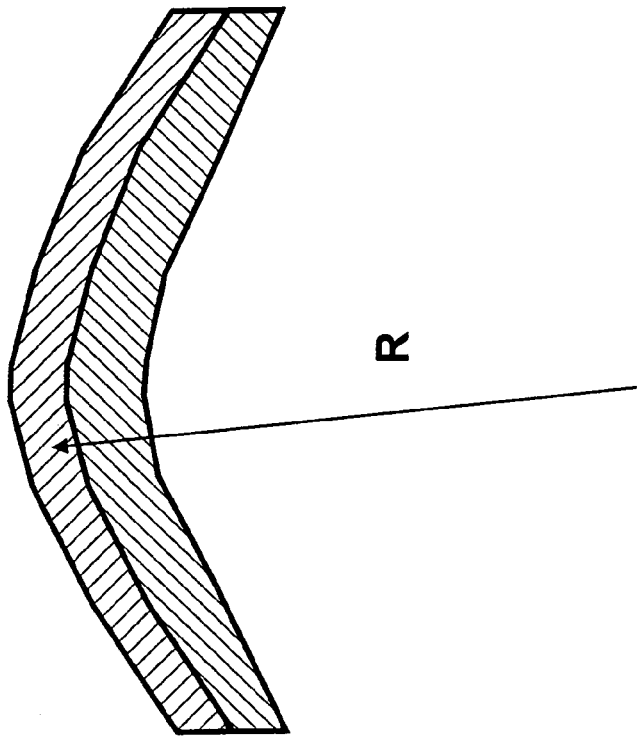

FIGS. 13 through 14 illustrate experimental results according to alternative embodiments of the present invention. These diagrams are merely examples, which should not unduly limit the scope of the claims herein. One of ordinary skill in the art would recognize many variations, modifications, and alternatives. As illustrated certain bent wafers have considerable stored energy, which if misdirected is sufficient to cause wafer breakage during a process for manufacturing strained silicon materials using layer transfer techniques. As shown, the stored energy can be calculated using elasticity theory. The substrate is silicon with doping 1E15 p-type. The handle substrate is silicon boron doped to 1E15. The stored energy "U" has been provided using the relationship in FIG. 13. The energy, U, per unit area can be found by setting L=W=1 meter. The Young's elasticity modulus E=169GPa. The thickness h is h=0.75 E-3 meter and the radius of the bend or curvature is R=0.5 meter according to this example. The total stored energy is U=11.88 Joules per m^2, which is far larger than the wafer bonding energy. In a specific embodiment, the backing wafer provides guidance and support to prevent breakage due to unwanted and/or undesirable forces resulting from release of the stored energy in the bent wafer pair during cleavage. Since the wafers may be bent near the breaking point, placing the backing plate on the wafer reduces breakage by limiting bending stresses within the wafers while cleave forces are applied. As merely an example, properties of a backing plate that has been glued on using an adhesive material described below according to a preferred embodiment of the present invention.

Adhesive: Silicone pressure sensitive type, Mfg. Dielectric Polymers Inc. 218 Race St., Holyoke Mass. 01040, USA
General Properties:
Adheres on contact;
Thickness<2 mils;
No drying or curing;
No surface preparation
Adheres extremely well to atomically flat silicon single crystal;
Adheres extremely well to acrylic and polycarbonate plastics;
Is dispensed as a sheet between removable plastic cladding layers;
Soluble in alcohol acetone or other solvents;
Functions over a large temperature range 0 to 260 C.

Of course, there can be other variations, modifications, and alternatives. Plastic Backing Plate: Lexan XL 10 Polycarbonate, Mfg. GE Plastics, General Electric Company, USA
General Properties:
Free of metals and common electronically deleterious contaminants.
Thickness: 0.093 inches;
Elongation before rupture >7% at 23 C;
Thermoplastic;
Moldable by bending at 110 C;
Glass Transition temperature >70 C;
Elastic Modulus 1-2 GPa.

Of course, there can be other variations, modifications, and alternatives. Additionally, the above examples have been provided as merely illustrations, which should not unduly limit the scope of the claims herein. The backing plate and adhesive have been provided by reference to FIG. 14. Additional aspects of the present invention can be found throughout the present specification and more particularly below.

In a specific embodiment, a method for fabricating a semiconductor substrate is briefly described below.

1. Provide a handle substrate (having a back side and a face, the planar configuration being characterized by an x-y plane) in a planar configuration;
2. Conform the backside of the handle substrate to an annular bending member, which is characterized by a first radius of curvature to cause the handle substrate to be in an annular configuration;
3. Provide a donor substrate having a face, a thickness of material coupled to the face, a cleave region defining the thickness of material, and a backside;
4. Join the face of the donor substrate to the face of the handle substrate, while the handle substrate has been maintained on the annular bending member, to cause strain within at least the thickness of material of the donor substrate;
5. Couple a backing plate overlying the backside of the donor substrate to conform a shape of the backing plate to the backside of the donor substrate;
6. Initiate removal of the thickness of material from the donor substrate by causing a cleaving action within a portion of the cleave region of the donor substrate, while the backing plate has been maintained on the donor substrate;
7. Transfer the thickness of material from the donor substrate to the handle substrate, while the annular bending member remains coupled to the handle substrate; and
8. Detaching the handle substrate, including the thickness of material in a strained state, from the annular bending member;
9. Cause an additional strain to the thickness of material as the handle substrate, including the thickness of material changes in shape from the annular configuration to the planar configuration; and
10. Perform other steps, as desired.

The above sequence of steps provides a method according to an embodiment of the present invention. As shown, the method uses a combination of steps including a way of forming a strained silicon layer overlying a handle substrate. In a preferred embodiment, the donor and handle substrates each include a backing material to enhancing cleaving of the thickness of material in a strained state. Other alternatives can also be provided where steps are added, one or more steps are removed, or one or more steps are provided in a different sequence without departing from the scope of the claims herein. Further details of the present method can be found throughout the present specification and more particularly below.

FIGS. 15 through 23 illustrate a method for forming a strained silicon substrate according to a preferred embodiment of the present invention. These diagrams are merely examples, which should not unduly limit the scope of the claims herein. One of ordinary skill in the art would recognize other variations, modifications, and alternatives. In a specific embodiment, the method is directed to forming a strained layer of semiconductor material, e.g., silicon, germanium, silicon carbide, gallium arsenide, Group III/V, silicon germanium alloy. The method includes providing a non-deformable surface region 1501 having a first predetermined radius of curvature, which is defined by R(1) and is defined normal to the surface region, as illustrated by FIGS. 15 and 16. The non-deformable surface region is provide on substrate 1501, which may be any substrate and/or chuck, e.g., electro-static chuck. Preferably, the first radius of curvature is defined by an imaginary circle, which is continuous or variable across a surface of the substrate. There can be other variations, modifications, and alternatives.

The method includes providing a handle substrate (e.g., silicon wafer, quartz, glass, metal) 1505 having a first thickness. Preferably, the handle substrate has a face 1509 and a backside 1507 according to a specific embodiment. The method includes a step of overlying the backside of the handle substrate on a portion of the surface region having the predetermined radius of curvature to cause a first bend 1601 within the thickness of material to form a first strain within a portion of the first thickness, as illustrated by FIG. 16. As shown, the handle substrate is formed overlying the annular region defined by the first radius of curvature according to a specific embodiment.

Figure 17:
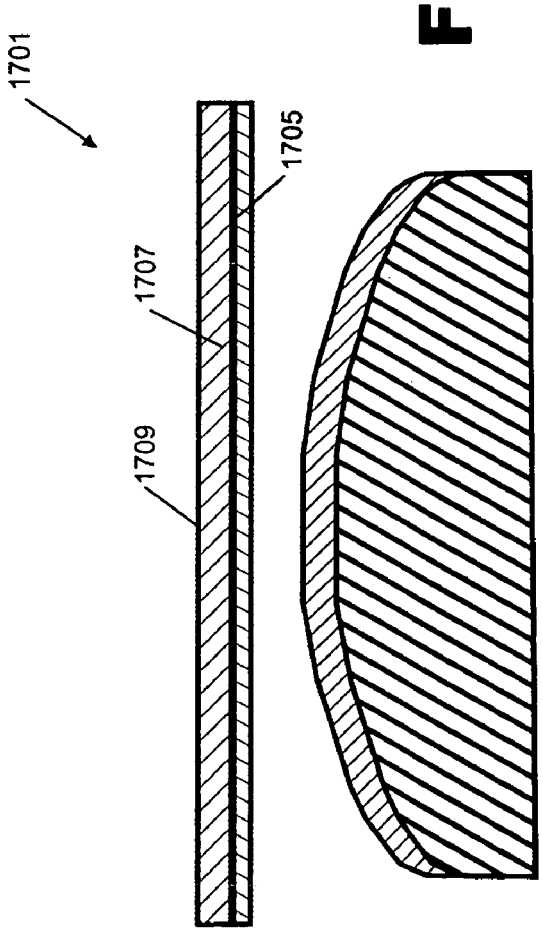

Referring to FIG. 17, the method provides a donor substrate 1701 having a second thickness, which has a face 1705, a backside 1709, and a cleave plane 1707 or region defined within the second thickness. Depending upon the embodiment, the cleave region can be formed using a variety of techniques. That is, the cleave region can be formed using any suitable combination of implanted particles, deposited layers, diffused materials, patterned regions, and other techniques. In a specific embodiment, the method introduces certain energetic particles using an implant process through a top surface of the semiconductor substrate, which can be termed a donor substrate, to a selected depth, which defines the thickness of the semiconductor material region, termed the "thin film" of material. A variety of techniques can be used to implant the energetic particles into a single crystal silicon wafer according to a specific embodiment. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques can be particularly effective for larger surface regions according to a specific embodiment. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface of the donor substrate.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about −20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. Of course, there can be other variations, modifications, and alternatives.

Depending upon the embodiment, there may be other techniques for forming a cleave region and/or cleave layer. As merely an example, such cleave region is formed using other processes, such as those using a silicon-germanium cleave plane developed by Silicon Genesis Corporation of Santa Clara, Calif. and processes such as the SmartCut™ process of Soitec SA of France, and the Eltran™ process of Canon Inc. of Tokyo, Japan, any like processes, and others. Of course, there may be other variations, modifications, and alternatives.

Figure 18:
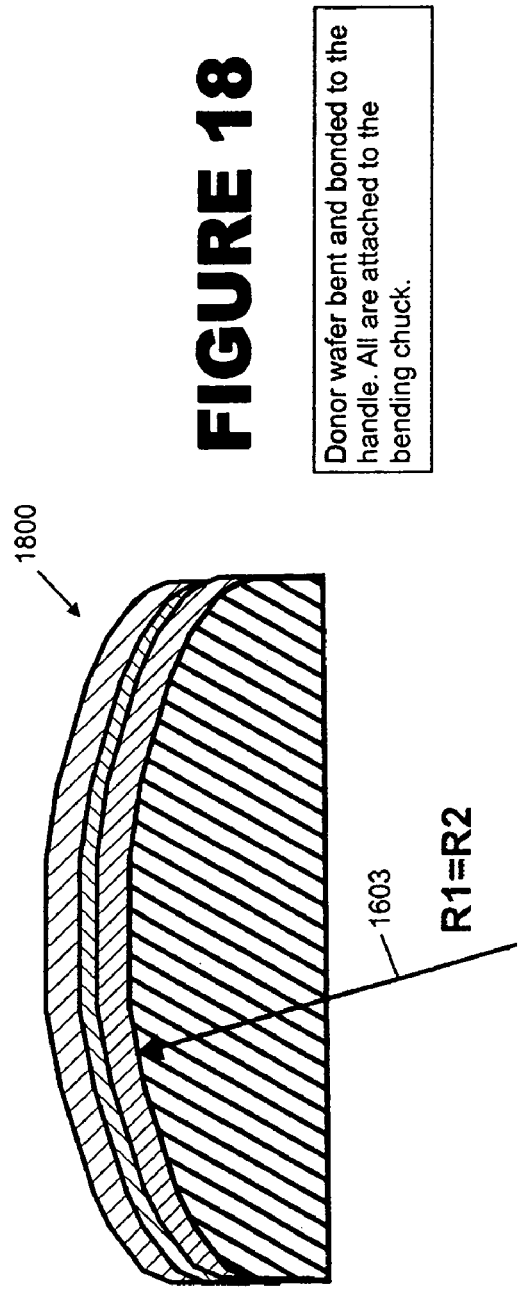

Referring to FIG. 18, the method includes a step of overlying the face of the donor substrate on a portion of the face of the handle substrate to cause a second bend within the thickness of material of the donor substrate to form a second strain within a portion of the second thickness, which is defined between the face and cleave region of the donor substrate. As shown, the donor substrate portion within the vicinity of the bond interface is strained via compressive mode according to a specific embodiment. Alternatively, the thickness of material may be in a tensile mode depending upon the specific embodiment using a different annular bending member. Of course, there can be other variations, modifications, and alternatives.

Referring again to FIG. 18, the method includes joining 1800 the face of the donor substrate to the face of the handle substrate forms a sandwich structure while maintaining the first bend in the handle substrate and the second bend in the donor substrate. In a preferred embodiment, the first bend is equal to the second bend. That is, the radius of curvature for each of the substrates is equal according to the preferred embodiment. Preferably, joining occurs using a low temperature process such as plasma activated bonding 505 or the like. In a specific embodiment, the plasma activated bonding is maintained at less than 1000 degrees Celsius or less than 500 degrees Celsius. Bonding can occur via silicon dioxide surface or silicon to silicon surfaces depending upon the embodiment. Other types of bonding include, but are not limited to, glue layers, etc. Depending upon the embodiment, the joining is a rolling process that physically mates the face of the second substrate to the face of the first substrate using a rolling action defined by an axis formed between a separated region between the face of the second substrate and the face of the first substrate and a connected region between the face of the second substrate and the face of the first substrate. The handle substrate portion within the vicinity of the in bond interface is trained via compression mode. Of course, there can be other variations, modifications, and alternatives.

In a specific embodiment, the method includes performing a bond treatment to finish the joining of the donor and handle substrates together in a substantially permanent manner. The bond treatment can be any suitable technique such as thermal annealing, and the like. The bond treatment is often a bake treatment, which is thermal in process according to a specific embodiment. The thermal process is often an elevated temperature and/or processing condition to firmly attach the handle and donor substrates together according to a specific embodiment. Of course, there can be other variations, modifications, and alternatives.

Figure 19:
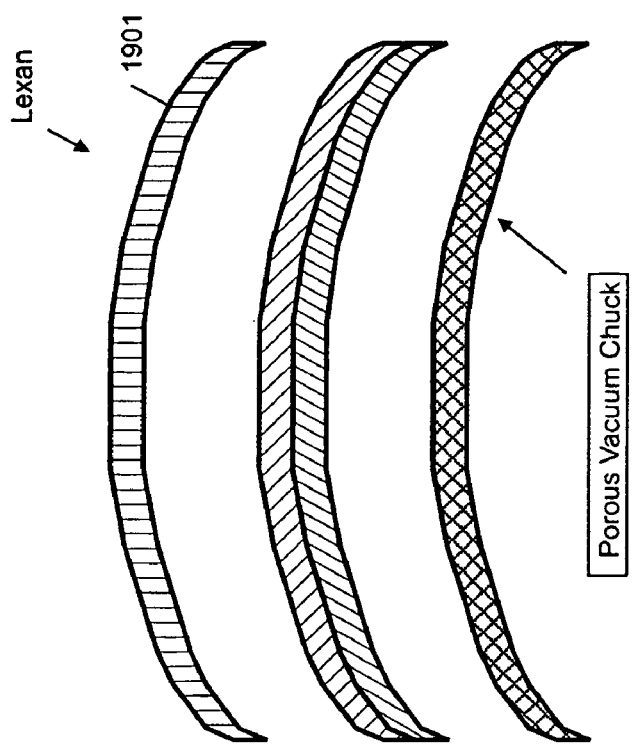
Figure 20:
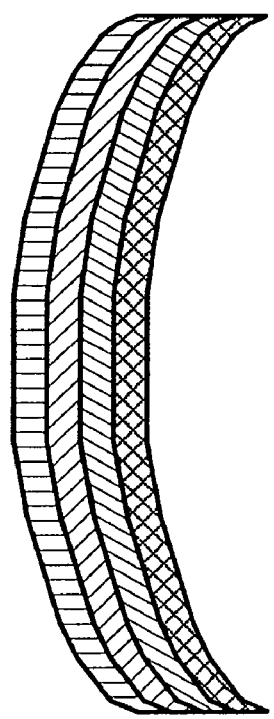
Figure 23:
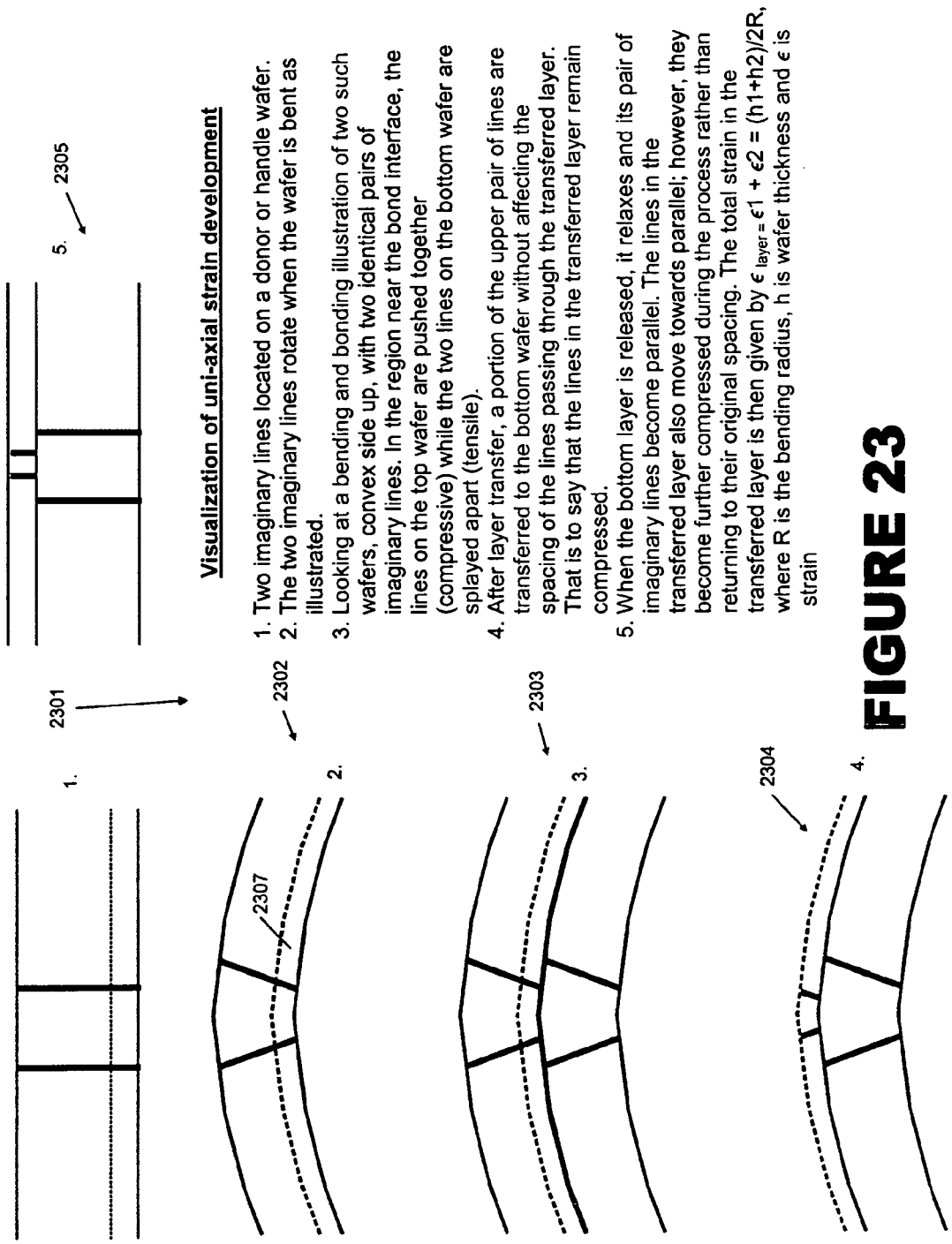

Referring to FIGS. 19 and 20, the method couples a backing plate 1901 overlying the backside of the donor substrate to conform a shape of the backing plate to the backside of the donor substrate according to a specific embodiment. The backing plate can be made of any suitable material, which can make the donor substrate more rigid and suitable for cleaving according to a preferred embodiment. The backing plate can be a metal plate, a semiconductor plate, a dielectric plate, a polymer plate (e.g., plastic), any combination of these, and the like. As merely an example, the backing plate is the Lexan XL 10 Polycarbonate manufactured by GE Plastics, General Electric Company, USA, but is not limited to this material. The backing plate can be temporarily affixed using a silicone type adhesive or other temporary material according to a specific embodiment. Of course, there can be other variations, modifications, and alternatives.

Referring again to FIG. 20, the method forms a composite structure, which is suitable for cleaving according to a specific embodiment. The composite structure includes the handle substrate, donor substrate, backing plate, and annular member, which causes the strained regions according to a specific embodiment. As shown, each of the substrates, including donor and handle, is subjected to backing plates according to a specific embodiment.

Referring to FIG. 21, the method initiates removal of the thickness of material 2101 from the donor substrate by causing a cleaving action within a portion of the cleave region of the donor substrate, while the backing plate 1901 has been maintained on the donor substrate. In a specific embodiment, initiation of the removal of the thickness of material from the donor substrate occurs using a controlled cleaving process, such as the noted above. In another embodiment, the removal can occur using a process commonly called the Smart Cut™ process marketed by Soitec SA of France. Another technique can be a process called ELTRAN™ process marketed by Canon, Inc. Any combination of these processes can also be used.

In a specific embodiment, the method conforms the shape of the thickness of material to the handle substrate as a radius of curvature on the handle substrate approaches a second predetermined radius (R2) of curvature. Preferably, the second radius of curvature is defined by infinity, which is where the substrate is essentially flat and free from any bends. That is, the handle substrate, which was in an annular or bent configuration, is now in a substantially planar configuration and includes a strained thickness of material released from the donor substrate according to a specific embodiment. The method increases a magnitude of the strain from an initial strain caused from the initial radius of curvature to an increased strain at a determined amount within the thickness of material as the thickness of conforms in shape to the second substrate as the radius of curvature of the handle substrate approaches the second predetermined radius of curvature, which is essentially infinity, as illustrated by FIG. 22. As shown, the handle substrate 2201 includes an overlying strained layer 2203, which preferably includes a magnitude of strains from the first bend and the re-bend back to the flat shape structure according to a specific embodiment.

The above sequence of steps provides a method according to an embodiment of the present invention. As shown, the method uses a combination of steps including a way of forming a strained silicon layer overlying a handle substrate. Other alternatives can also be provided where steps are added, one or more steps are removed, or one or more steps are provided in a different sequence without departing from the scope of the claims herein We have provided a stain visualization example, which has been illustrated by FIG. 23. This diagram is merely an example, which should not unduly limit the scope of the claims herein. One of ordinary skill in the art would recognize many variations, modifications, and alternatives. As shown, strain within the donor substrate can be illustrated by the two imaginary lines as shown by reference numeral 2301. As the donor substrate is first bent, illustrated by reference numeral 2302, strain within the thickness of material 2307 increases according to a specific embodiment. Next, the donor and handle substrates are bonded to each other, as illustrated by reference numeral 2303. As shown by reference numeral 2304, after layer transfer, strain within the thickness of material is substantially unchanged and is in a compressive state according to a specific embodiment. As the handle and thickness of material are released back to a planar state, strain increases as evidenced by a closer spacing of the lines on the thickness of material, as illustrated by reference numeral 2305. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a strained silicon layer of semiconductor material, the method comprising:

providing a deformable surface region having a first predetermined radius of curvature, the first predetermined radius of curvature being defined by R(1) and being defined normal to the surface region;

coupling a backside surface of the deformable surface with a backing plate to cause the deformable surface to be substantially non-deformable;

providing a first substrate having a first thickness, the first substrate having a face, a backside, and a cleave plane within the first thickness;

overlying the backside of the first substrate on a portion of the surface region having the predetermined radius of curvature to cause a first bend within the thickness of material to form a first strain within a portion of the first thickness;

providing a second substrate having a second thickness, the second substrate having a face and a backside;

overlying the face of the second substrate on a portion of the face of the first substrate to cause a second bend within the thickness of material to form a second strain within a portion of the second thickness;

joining the face of the second substrate to the face of the first substrate to form a sandwich structure while maintaining the first bend in the first substrate and the second bend in the second substrate; and releasing a portion of a thickness of the first substrate along a vicinity of the cleave plane to free the portion of the thickness of material from a remaining portion of the first substrate while being attached to the second substrate; and conforming the shape of the thickness of material to the second substrate as a radius of curvature on the second substrate approaches a second predetermined radius (R2) of curvature; and increasing a magnitude of a strain from the first strain to a third strain within the thickness of material as the thickness of material of conforms in shape to the second substrate as the radius of curvature on the second substrate approaches the second predetermined radius of curvature.

2. The method of claim 1 wherein the joining is provided by plasma activated bonding.

3. The method of claim 2 wherein the plasma activated bonding is maintained at less than 1000 degrees Celsius.

4. The method of claim 1 wherein the first radius of curvature is defined by an imaginary circle, the imaginary circle being continuous or variable.

5. The method of claim 1 wherein the second radius of curvature is defined by infinity.

6. The method of claim 1 wherein the releasing comprises a controlled cleaving process.

7. The method of claim 1 wherein the releasing comprises a thermal cleaving process.

8. The method of claim 1 wherein the joining is a rolling process that physically mates the face of the second substrate to the face of the first substrate using a rolling action defined by an axis formed between a separated region between the face of the second substrate and the face of the first substrate and a connected region between the face of the second substrate and the face of the first substrate.

9. The method of claim 1 wherein the first substrate is overlying the surface region and maintained using a mechanical clamp.

10. The method of claim 1 wherein the second substrate is overlying the first substrate and maintained using a mechanical clamp.

11. The method of claim 1 wherein the first substrate is overlying the surface region by a vacuum or an electrostatic force.

12. The method of claim 1 wherein the joining is a bonding process using a silicon bearing material.

13. The method of claim 1 wherein the first substrate comprises a first silicon wafer and the second substrate comprises a second silicon wafer.

14. The method of claim 1 further comprising subjecting the sandwich structure to a heat treatment process.

15. The method of claim 14 wherein heat treatment process maintains substantially no stress at an interface between the first substrate and the second substrate.

16. The method of claim 1 wherein the strain in the released thickness of material is characterized by a tensile mode.

* * * * *